United States Patent [19]
Oashi et al.

[11] Patent Number: 5,721,444
[45] Date of Patent: Feb. 24, 1998

[54] THIN-FILM TRANSISTOR HAVING A BURIED IMPURITY REGION AND METHOD OF FABRICATING THE SAME

[75] Inventors: Toshiyuki Oashi; Jiro Matsufusa; Takahisa Eimori; Tadashi Nishimura, all of Hyogo, Japan

[73] Assignee: Mitsubishi Denki Kabushiki Kaisha, Tokyo, Japan

[21] Appl. No.: 824,550

[22] Filed: Mar. 25, 1997

Related U.S. Application Data

[63] Continuation of Ser. No. 576,352, Dec. 21, 1995, abandoned.

[30] Foreign Application Priority Data

Dec. 22, 1994 [JP] Japan ............................ 6-319684

[51] Int. Cl.$^6$ .......................... H01L 27/01; H01L 27/12
[52] U.S. Cl. ............................................ 257/347; 257/349
[58] Field of Search .................................. 257/350, 351, 257/352, 353, 349, 247

[56] References Cited

U.S. PATENT DOCUMENTS

| | | | |
|---|---|---|---|
| 5,138,409 | 8/1992 | Kauai | 257/349 |
| 5,294,821 | 3/1994 | Iwamatsu | 257/351 |
| 5,359,219 | 10/1994 | Hwang | 257/351 |
| 5,440,161 | 8/1995 | Iwamatsu et al. | 257/350 |
| 5,488,242 | 1/1996 | Tsurura et al. | 257/347 |
| 5,506,436 | 4/1996 | Hayashi et al. | 257/351 |

FOREIGN PATENT DOCUMENTS

| | | |
|---|---|---|
| 63-5559 | 1/1988 | Japan . |
| 2-144969 | 6/1990 | Japan . |
| 3-129764 | 6/1991 | Japan . |
| 4-6106 | 2/1992 | Japan . |
| 4-250633 | 9/1992 | Japan . |
| 6-45344 | 2/1994 | Japan . |

OTHER PUBLICATIONS

A.H. Hamdel et al. Novel SOI CMOS Design Using Ultra Thin Near Intrinsic Substrate, IEDM82, pp. 107–110.

*Primary Examiner*—Tom Thomas
*Assistant Examiner*—David B. Hardy
*Attorney, Agent, or Firm*—Lowe, Price, LeBlanc & Becker

[57] ABSTRACT

A buried insulating layer is provided in a semiconductor substrate, in a position separated from its major surface. A LOCOS isolation film is provided in the major surface of the semiconductor substrate for isolating an active region from other active regions. A thin-film transistor is provided in the active region. The thin-film transistor comprises a gate electrode which is provided on the active region with interposition of a gate insulating layer. A pair of source/drain layers are provided in the major surface of the semiconductor substrate on both sides of the gate electrode. A high-concentration impurity layer is provided in the semiconductor substrate immediately under the buried insulating layer.

8 Claims, 25 Drawing Sheets

THIN-FILM TRANSISTOR HAVING A BURIED IMPURITY REGION AND METHOD OF FABRICATING THE SAME

This application is a continuation of application Ser. No. 08/576,352 filed Dec. 21, 1995, now abandoned.

BACKGROUND OF THE INVENTION

1. Field of the Invention

The present invention generally relates to a semiconductor device, and more specifically, it relates to a semiconductor device comprising a thin-film SOI-MOSFET (silicon on insulator-metal oxide semiconductor field effect transistor). The present invention also relates to a method of fabricating such a semiconductor device.

2. Description of the Background Art

FIG. 1 is a sectional view showing a conventional thin-film SOI-MOSFET (IEDM82-107 to 109). Referring to FIG. 1, the conventional thin-film SOI-MOSFET comprises a semiconductor substrate 1a consisting of single-crystalline silicon. An insulating layer 2 of 5000Å in thickness is provided on the semiconductor substrate 1a. Elements such as transistors (each including a gate 8, source/drain layers 5, a gate insulating film 7 and a near intrinsic Si layer 6) are formed on the insulating layer 2. The elements which are formed on the insulating layer 2 are substantially completely insulated from the semiconductor substrate 1a. When this structure is applied to a memory device such as a DRAM (dynamic random access memory), therefore, the device is free from soft errors and reduced in junction capacitance. Thus, the device is advantageously increased in refresh time and improved in sensitivity. When the structure is applied to a logic circuit, on the other hand, the parasitic capacitance is so reduced that the transistor speed can be increased. Further, this structure is extremely superior in performance as compared with a case of directly forming the elements on the semiconductor substrate 1a, whereby application to a memory device such as a mass storage DRAM (256M) or a logic is expected.

In the conventional thin-film SOI-MOSFET shown in FIG. 1, the elements are formed at intervals, to be electrically isolated from each other.

FIG. 2 is a partially fragmented perspective view showing a conventional thin-film SOI-MOSFET, whose elements are electrically isolated from each other by a LOCOS (local oxidation of silicon) film which is formed by field oxidation.

The perspective view shown in FIG. 2 illustrates a section 100 which is parallel to a gate electrode (word line) 8, and another section 101 which is perpendicular to the gate electrode 8.

Referring to FIG. 2, a buried oxide film 2 consisting of silicon dioxide is formed on a semiconductor substrate 1a. A LOCOS isolation film 3b is formed on the buried oxide film 2, for isolating an active region from other active regions. The active region is provided with a channel layer 4 which is formed to extend along the word line (direction shown by arrow 102 in FIG. 2), and source/drain layers 5 which are formed to be adjacent to the channel layer 4. A combination (active region) of the channel layer 4 and the source/drain layers 5 is hereafter called an SOI layer 6. The gate electrode (word line) 8 is provided on the channel layer 4 with interposition of a gate insulating layer 7 consisting of silicon oxide. An end (bird's beak) 10 of the LOCOS isolation oxide film 3b is in contact with the SOI layer 6 at a boundary portion 9. A combination of the semiconductor substrate 1a, the buried oxide film 2, the LOCOS isolation film 3b and the SOI layer 6 is hereafter called an SOI substrate 1b.

FIGS. 3 and 4 are sectional views taken along the lines 3—3 and 4—4 in FIG. 2 respectively. Namely, FIG. 3 shows a section of a region provided with no LOCOS isolation film 3b, and FIG. 4 shows a section of a portion provided with the end poriton 10 of the LOCOS isolation film 3b. Referring to FIG. 3, the thin-film SOI-MOSFET has dimensions as designed in the region provided with no LOCOS isolation film 3b, with no problem.

Referring to FIG. 4, however, the end portion 10 of the LOCOS isolation film 3b contributes as an oxide film between the gate insulating layer 7 and the SOI layer 6 in the portion provided with this end portion (bird's beak) 10. The end portion 10 of the LOCOS isolation film 3b serving as an oxide film forms a parasitic SOI-MOSFET having an extremely thin SOI layer 6. The parasitic SOI-MOSFET shown in FIG. 4 exhibits characteristics which are different from those of the thin-film SOI-MOSFET shown in FIG. 3.

This parasitic SOI-MOSFET, which cannot be formed if not for the bird's beak, is formed for the following reason:

Referring to FIGS. 2 and 4, the parasitic SOI-MOSFET results from field oxidation for forming the LOCOS isolation film 3b. Namely, a thin oxide film is first formed on the SOI substrate 1b in formation of the LOCOS isolation film 3b, and a mask (not shown) of a pattern for a silicon nitride film is formed on this thin oxide film. Then, the SOI substrate 1b is oxidized through the mask of the pattern for a silicon nitride film. At this time, a thick silicon oxide film is formed on a portion not covered with the mask. At the same time, a silicon oxide film called a bird's beak (10) is formed under an end portion of the mask, to push up the mask between the same and the SOI layer 6. This silicon oxide film is called a bird's beak due to its sectional shape.

In the aforementioned field oxidation, the mask covers the active region to be provided with the source/drain layers 5 and the channel layer 4. As hereinabove described, the bird's beak which is a thin oxide film resulting from the field oxidation is formed around this active region. When the gate electrode 8 is formed as shown in FIG. 2, therefore, this inevitably leads to natural formation of the parasitic SOI-MOS transistor having the specific structure shown in FIG. 4 with the bird's beak 10 serving as an oxide film. In formation of the LOCOS isolation film 3b, it is impossible to avoid formation of the end portion 10 called a bird's beak.

In the portion provided with the parasitic SOI-MOSFET shown in FIG. 4, the thickness of the SOI layer 6 is smaller than that in the portion forming the ordinary thin-film SOI-MOSFET shown in FIG. 3. Thus, the parasitic SOI-MOSFET shown in FIG. 4 is different in structure from the SOI-MOSFET shown in FIG. 3, which must be originally formed, as hereinabove described.

Further, the parasitic SOI-MOSFET shown in FIG. 4 has drain current-gate voltage characteristics which are different from those of the normal thin-film SOI-MOSFET shown in FIG. 3.

Referring to an observation curve 12 shown in FIG. 5B, the logarithmic value of the drain current is increased in proportion to the gate voltage as the gate voltage is increased, in ideal drain current-gate voltage characteristics of a transistor. When the gate voltage reaches the threshold value of the transistor, the rate of increase of the drain current value with respect to increase of the gate voltage is reduced. Thereafter the drain current remains at a constant value regardless of increase of the gate voltage.

However, drain current-gate voltage characteristics of the conventional thin-film SOI-MOSFET shown in FIG. 2 provide an observation curve 11 shown in FIG. 5A. Referring to the observation curve 11 shown in FIG. 5A, the thin-film SOI-MOSFET shown in FIG. 2 having the parasitic SOI-MOSFET exhibits such specific characteristics that the drain current is increased in proportion to the gate voltage when the gate voltage is increased so that the drain current thereafter remains at a constant value, while a current called a hump current having a maximal point P and a minimal point Q appears before the drain current reaches the constant value.

It is known that the observation curve 11 shown in FIG. 5A is composition of characteristics of a plurality of transistors, i.e., the characteristics (curves 12 and 13) of the transistor having correct dimensional accuracy (the normal SOI-MOSFET shown in FIG. 3) and the parasitic SOI-MOSFET shown in FIG. 4.

Referring to the curves 12 and 13 shown in FIG. 5B, the logarithmic values of the drain currents are proportionally increased with increase of the gate voltages, and thereafter reach constant values. When gate voltage values at points disordering the proportional relations are defined as threshold values, the threshold value (point T) of the parasitic SOI-MOSFET is smaller than that (point U) of the thin-film SOI-MOSFET having normal dimensions. When the gate voltages are gradually increased, the parasitic SOI-MOSFET exhibits a smaller drain current value than that of the thin-film SOI-MOSFET having normal dimensions.

On the other hand, a drain current which appears when the gate voltage is 0 V is called an OFF-state current. It is regarded as ideal that the OFF-state current is 0 A, since the same is a drain current which appears in an OFF state of the transistor. In practice, however, the drain current is not zeroed but flows in a small amount when the transistor is in an OFF state. In the observation curve 12 of FIG. 5B showing the characteristics of the thin-film SOI-MOSFET having normal dimensions, the drain current (OFF-state current) is at a value represented by symbol R when the gate voltage is 0 V. In the observation curve 13 showing the characteristics of the parasitic SOI-MOSFET, on the other hand, the drain current is extremely larger than that in the normal transistor, as shown by symbol S.

As hereinabove described, the OFF-state current is disadvantageously increased due to formation of the parasitic SOI-MOSFET. Such a phenomenon must be avoided to the utmost. In order to suppress this phenomenon, it may be possible to increase the threshold value of the parasitic SOI-MOSFET, thereby approaching the observation curve 13 shown in FIG. 5B to an observation curve 14.

The conventional semiconductor device, particularly the thin-film SOI-MOSFET employing LOCOS isolation, is provided with the thin-film SOI-MOSFET (FIG. 3) having normal dimensions and the parasitic SOI-MOSFET (FIG. 4), i.e., two thin-film SOI-MOSFETs having different characteristics, due to the aforementioned structure. This results in generation of a hump current and increase of the OFF-state current, as well as a malfunction of the finished semiconductor device and reduction of an operation margin.

SUMMARY OF THE INVENTION

Accordingly, an object of the present invention is to provide a thin-film SOI-MOSFET employing LOCOS isolation.

Another object of the present invention is to suppress generation of a hump current in a thin-film SOI-MOSFET employing LOCOS isolation.

Still another object of the present invention is to improve a thin-film SOI-MOSFET employing LOCOS isolation to be capable of suppressing an OFF-state current to the minimum value.

A further object of the present invention is to improve a method of fabricating a thin-film SOI-MOSFET employing LOCOS isolation to be capable of suppressing a hump current as well as an OFF-state current.

A semiconductor device according to a first aspect of the present invention comprises a semiconductor substrate having a major surface. A buried insulating layer is provided in the semiconductor substrate, in a position separated from the major surface. A LOCOS isolation film is provided in the major surface of the semiconductor substrate, to isolate an active region from other active regions. A transistor is provided in the active region. This transistor includes a gate electrode which is provided on the active region with interposition of a gate insulating layer, and a pair of source/drain layers which are provided in the major surface of the semiconductor substrate on both sides of the gate electrode. A high-concentration impurity layer is provided in the semiconductor substrate immediately under the buried insulating layer.

In a method of fabricating a semiconductor device according to a second aspect of the present invention, a buried insulating layer is first formed in a semiconductor substrate in a position separated from its major surface. A high-concentration impurity layer is formed in the semiconductor substrate immediately under the buried insulating layer. A LOCOS isolation film is formed in the surface of the semiconductor substrate for isolating an active region from other active regions. A gate electrode is formed on the active region with interposition of a gate insulating film. A pair of source/drain layers are formed in a surface of the active region on both sides of the gate electrode.

In the semiconductor device according to the first aspect of the present invention, the high-concentration impurity layer is provided in the semiconductor substrate immediately under the buried insulating layer, whereby a weak inversion region is formed in a lower portion of the channel layer due to difference between work functions of the high-concentration impurity layer and the channel layer of the transistor formed thereon.

In the method of fabricating a semiconductor device according to the second aspect of the present invention, the high-concentration impurity layer is formed immediately under the buried insulating layer, whereby a semiconductor device provided with a weak inversion region in a lower portion of a channel layer of a transistor is obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

Embodiment 1

Figure 6:
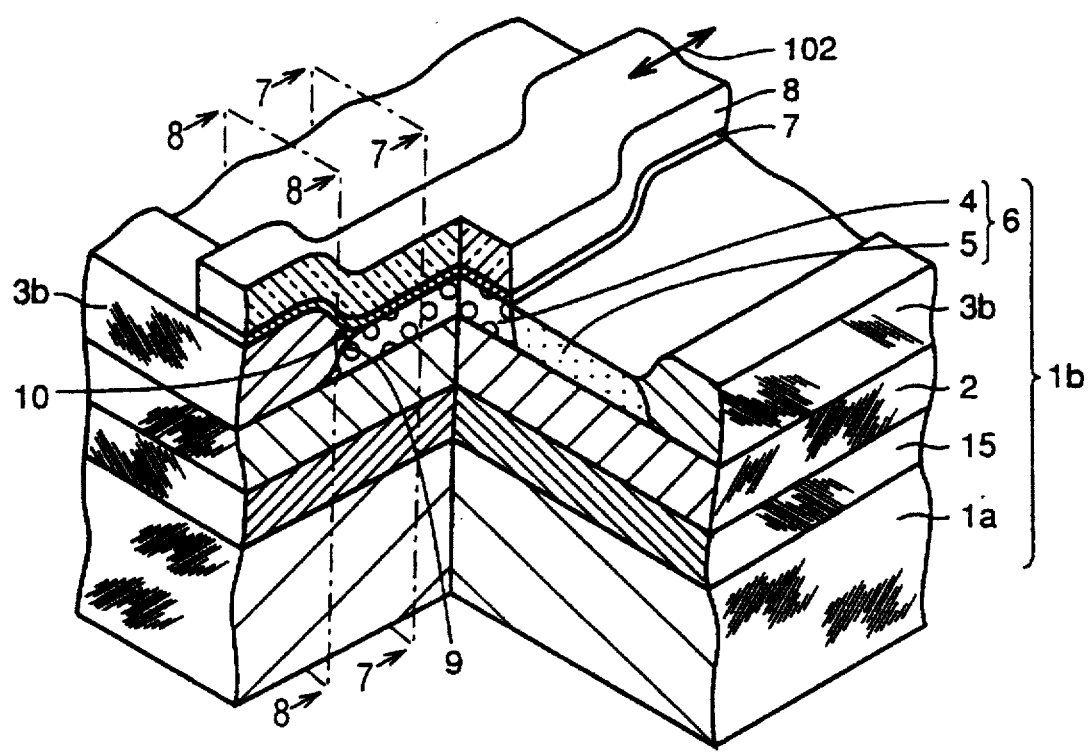
FIG. 6 is a partially fragmented perspective view showing a semiconductor device according to an embodiment 1 of the present invention.
Figure 7:
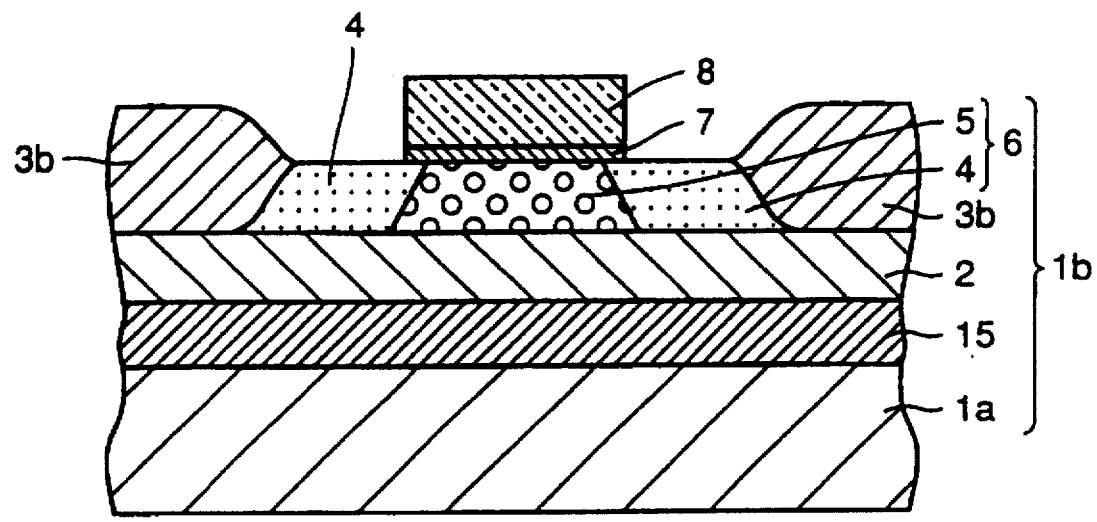
FIG. 7 is a sectional view taken along the line 7—7 in FIG. 6.
Figure 8:
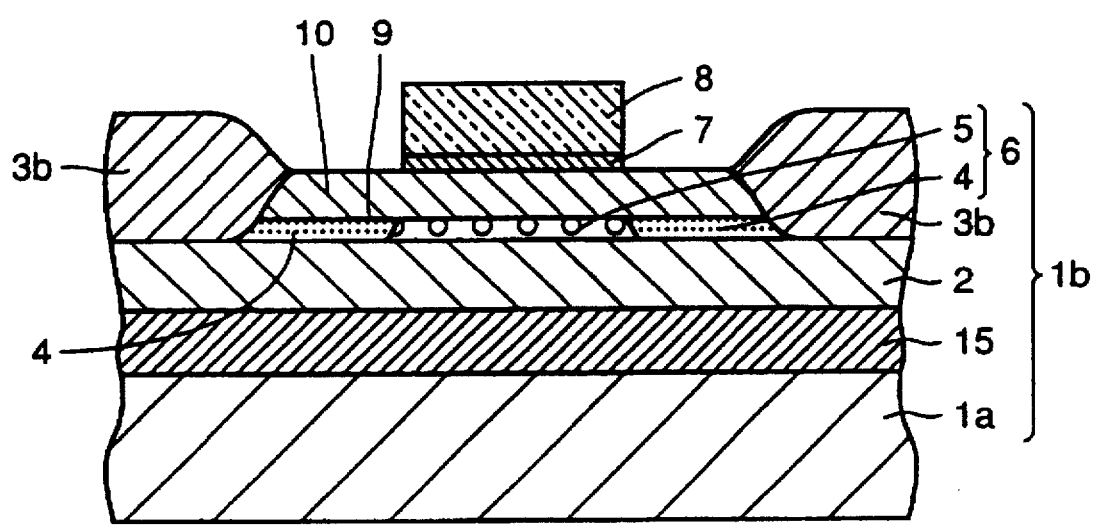
FIG. 8 a sectional view taken along the line 8—8 in FIG. 6.

FIG. 6 is a partially fragmented perspective view showing a semiconductor device according to an embodiment 1 of the present invention. FIGS. 7 and 8 are sectional views taken along the lines 7—7 and 8—8 in FIG. 6 respectively. The semiconductor device shown in these drawings are identical to the conventional one shown in FIGS. 2 to 4 except the following points, and hence portions identical or corresponding to those of the prior art are denoted by the same reference numerals, to omit redundant description.

Figure 1:
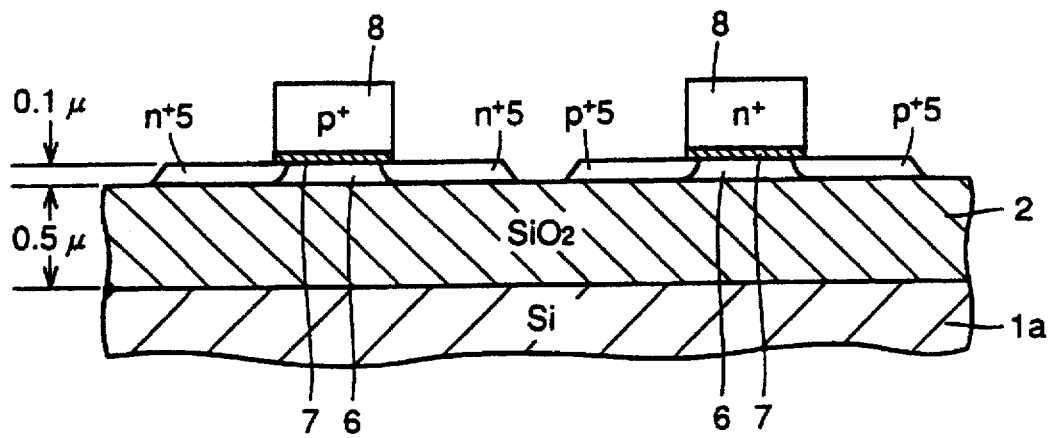
FIG. 1 is a sectional view showing a conventional thin-film SOI-MOSFET.
Figure 2:
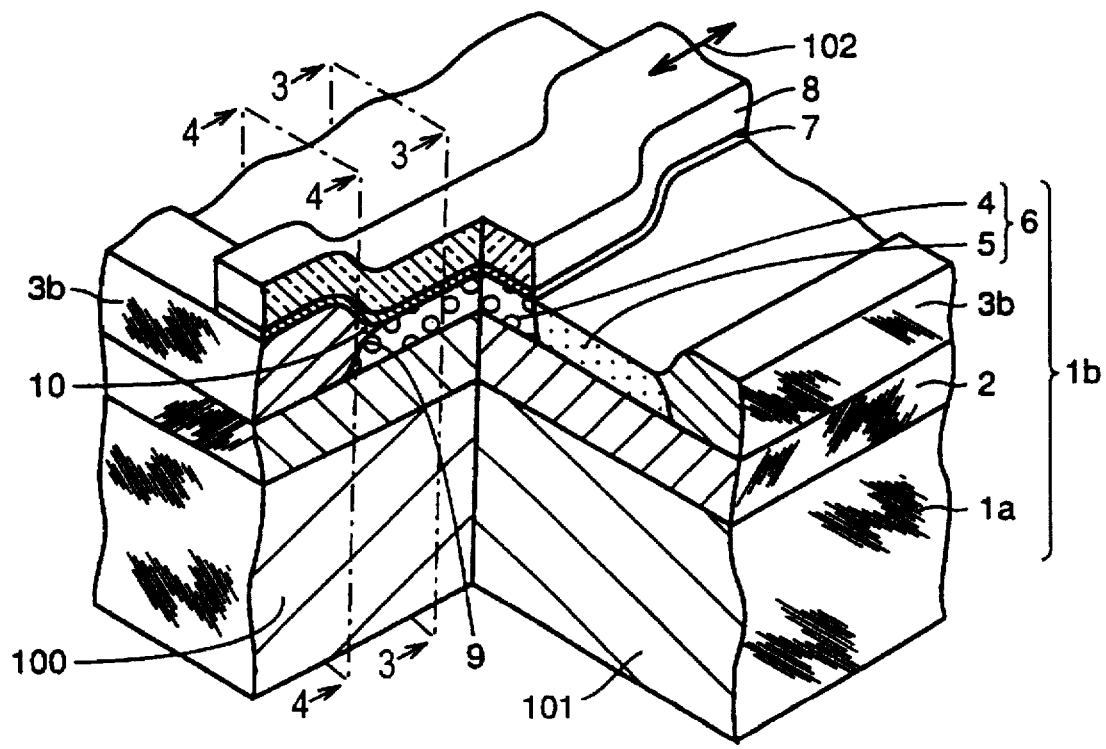
FIG. 2 is a partially fragmented perspective view of a conventional thin-film SOI-MOSFET whose elements are electrically isolated from each other by a LOCOS film.
Figure 3:
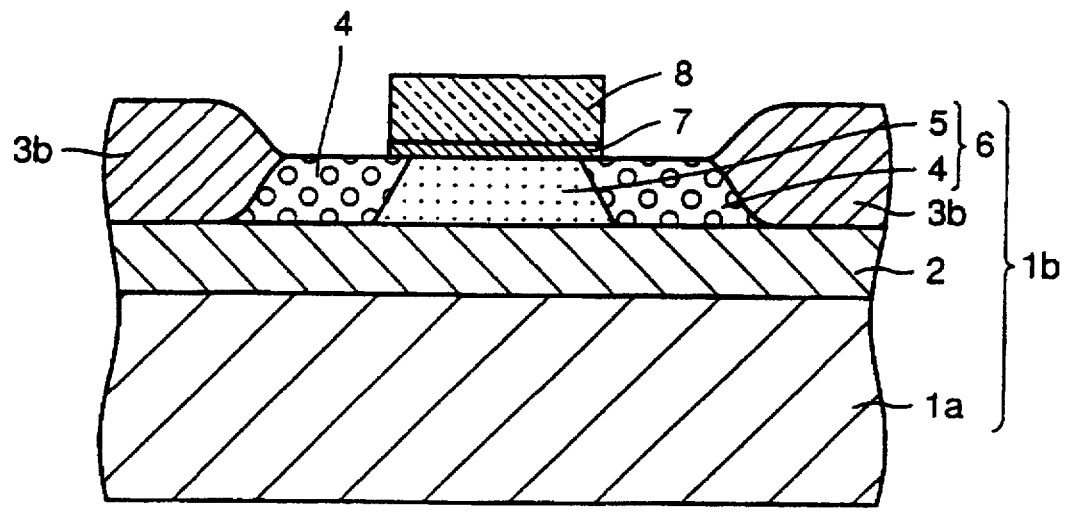
FIG. 3 is a sectional view taken along the line 3—3 in FIG. 2.
Figure 4:
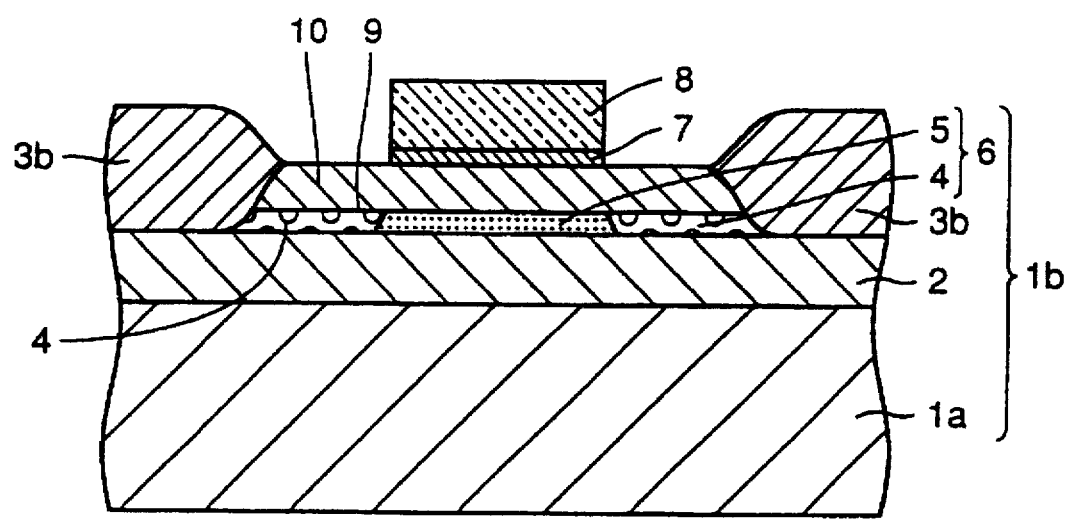
FIG. 4 is a sectional view taken along the line 4—4 in FIG. 2
Figure 5A:
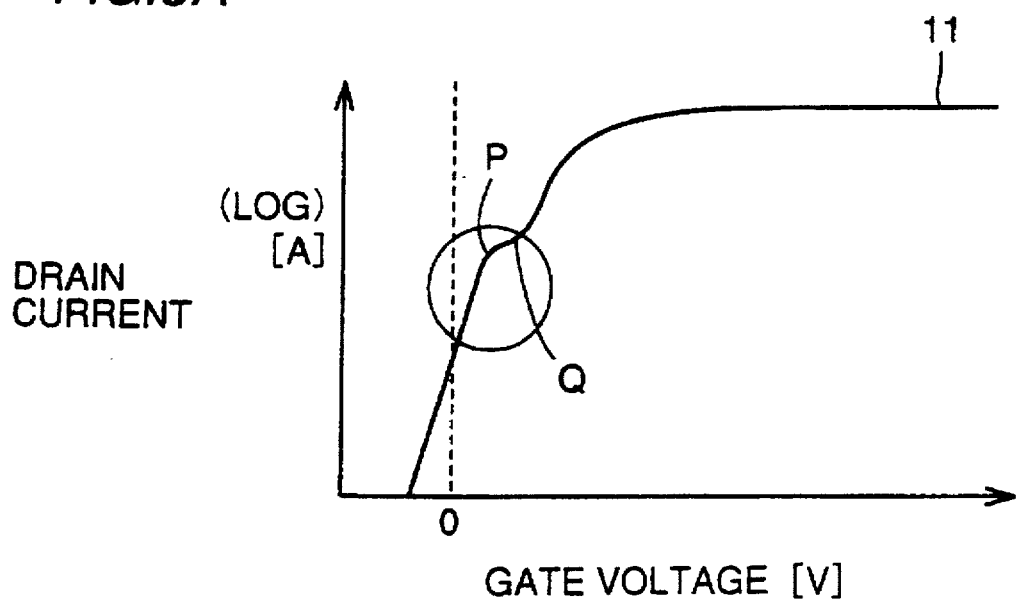
FIGS. 5A and 5B show drain current-gate voltage characteristics.
Figure 5B:
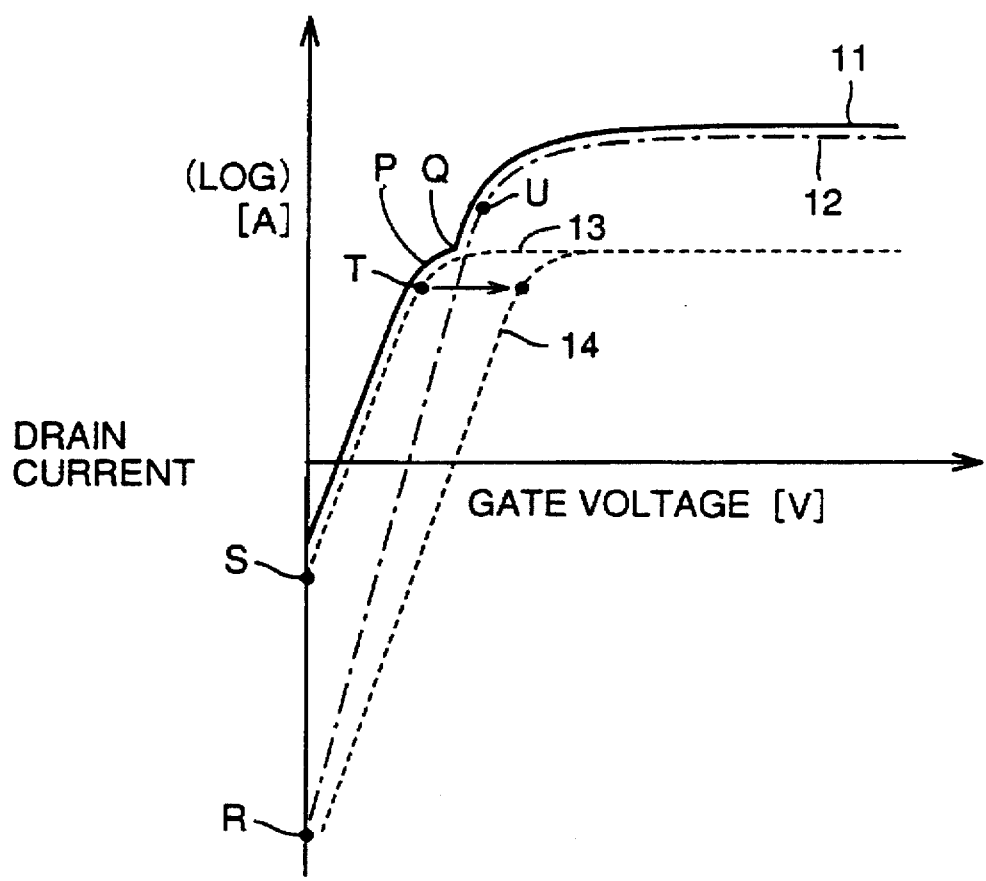
Figure 9:
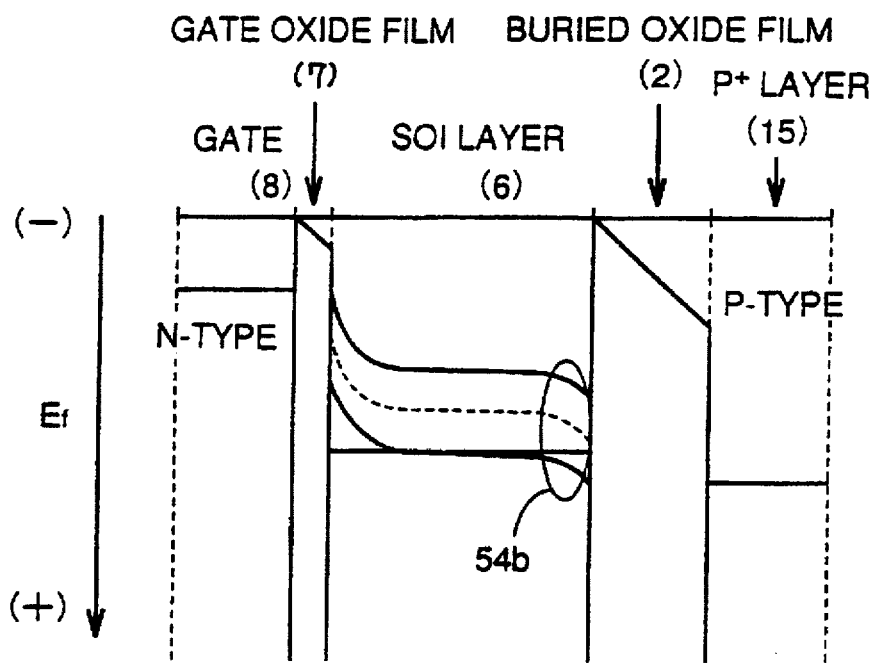
FIG. 9 is a band diagram of the semiconductor device according to the embodiment 1.

The semiconductor device according to the embodiment 1 is different from the conventional thin-film SOI-MOSFET shown in FIGS. 2 to 4 in a point that a high-concentration impurity layer 15 containing an impurity of the same type as source/drain layers 5 is provided in an SOI substrate 1b immediately under a buried insulating layer (oxide film) 2. A gate electrode (word line) 8 has a width of about 0.5 μm. Due to formation of the high-concentration impurity layer 15 particularly under a parasitic SOI-MOSFET immediately under the buried insulating layer 2, the following effects are attained:

Referring to FIG. 9, the high-concentration impurity layer 15 (illustrated as being of the P-type in FIG. 9) is so formed immediately under the buried oxide film 2 that the energy level of an SOI layer 6 is lower than that of the high-concentration impurity layer 15 which is formed under the same through the buried oxide film 2, whereby difference between work functions of the SOI layer 6 and the high-concentration impurity layer 15 is increased and a weak inversion region 54b is formed in a lower portion of the SOI layer 6. Thus, it is possible to attain a state corresponding to a case of applying a negative potential to a back gate (provided in a lower portion of a channel region) of an N-channel transistor of a generalized MOSFET (conventional MOSFET including no SOI layer). In this case, the threshold value of the parasitic SOI-MOSFET is increased, whereby an SOI-MOSFET having characteristics which are similar to those shown in the observation curve 14 of FIG. 5B can be obtained. Further, it is possible to remove an influence by a hump current which is caused by the parasitic SOI-MOSFET. In addition, it is also possible to remarkably reduce the OFF-state current. Thus, the electrical properties of the transistor are stabilized. Consequently, it is possible to inhibit the semiconductor device from a malfunction, with appearance of an effect such as increase of the operation margin.

In addition, it is possible to vary the degree of fluctuation in the threshold value of the transistor by adjusting the impurity concentration of the high-concentration impurity layer 15 which is formed immediately under the buried oxide film 2.

When an N-type high-concentration impurity layer is formed under a P-channel transistor forming region, it is possible to suppress generation of a hump current and an OFF-state current by reducing the threshold value of a parasitic SOI-MOSFET which is formed thereon, contrarily to the case of an N-channel transistor.

Particularly when N-type and P-type high-concentration impurity layers are formed under N-channel and P-channel transistor forming regions in a thin-film SOI-MOSFET comprising P-channel and N-channel transistors which are formed on the same substrate, it is possible to shift the threshold value of a parasitic SOI-MOSFET or the thin-film SOI-MOSFET having correct dimensions to a high or low potential through concentration of the high-concentration impurity diffusion layer as formed, as hereinabove described.

A method of fabricating the semiconductor device according to the embodiment 1 shown in FIG. 6 is now described. The following description is made on a method of fabricating a thin-film SOI-MOSFET having P-channel and N-channel transistors which are formed on the same substrate, in particular. Sectional views employed for the following description correspond to a section taken along the line 8—8 in FIG. 6, showing a portion which is formed with a parasitic SOI-MOSFET, i.e., a portion where an SOI layer has a small thickness.

Figure 10:
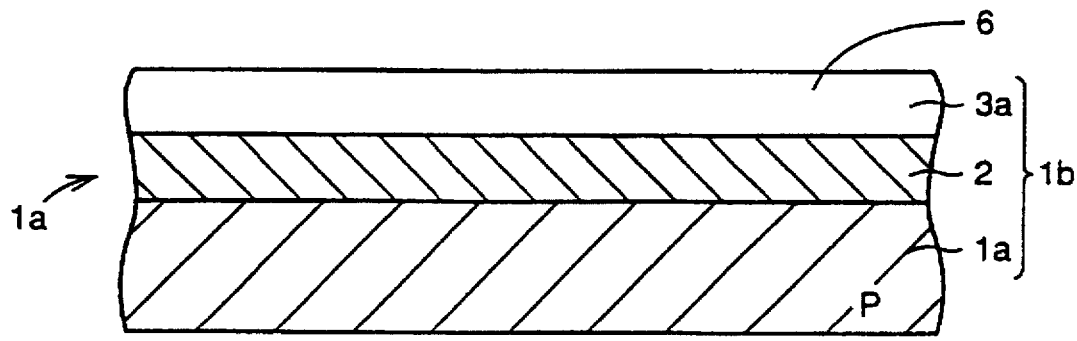
FIGS. 10 to 28 are sectional views successively showing steps of a method of fabricating the semiconductor device according to the embodiment 1.

Referring to FIG. 10, an SOI substrate 1b including an SIMOX (separation by implanted oxygen) semiconductor substrate 1a, a buried oxide film 2 and an SOI layer 6 consisting of silicon is formed. The SOI substrate 1b is obtained by implanting oxygen ions into the semiconductor substrate 1a having a P-type impurity concentration of about $15^{15}$ ions/cm$^3$ in a depth of about 1000 to 5000 Å from the surface of the semiconductor substrate 1a and forming the buried oxide film 2, consisting of silicon dioxide, having a thickness of 2000 to 4000 Å. Due to such formation of the buried oxide film 2 in the semiconductor substrate 1a, the SOI layer 6 of about 1000 Å in thickness is formed in a self-alignment manner in proximity to the surface of the semiconductor substrate 1a in which no oxygen ions are implanted. The SOI layer 6 may hereinafter be called a silicon layer 3a. This silicon layer 3a, which is a part of the semiconductor substrate 1a in practice, is hereinafter described as a layer which is independent of the semiconductor substrate 1a, in order to simplify the illustration. The buried oxide film 2, which is prepared from the semiconductor substrate 1a, is also described as a layer which is independent of the semiconductor substrate 1a. Therefore, the silicon layer 3a contains an impurity which is of the same type and the same concentration as that contained in the semiconductor substrate 1a provided under the buried oxide film 2, as a matter of course.

Figure 11:
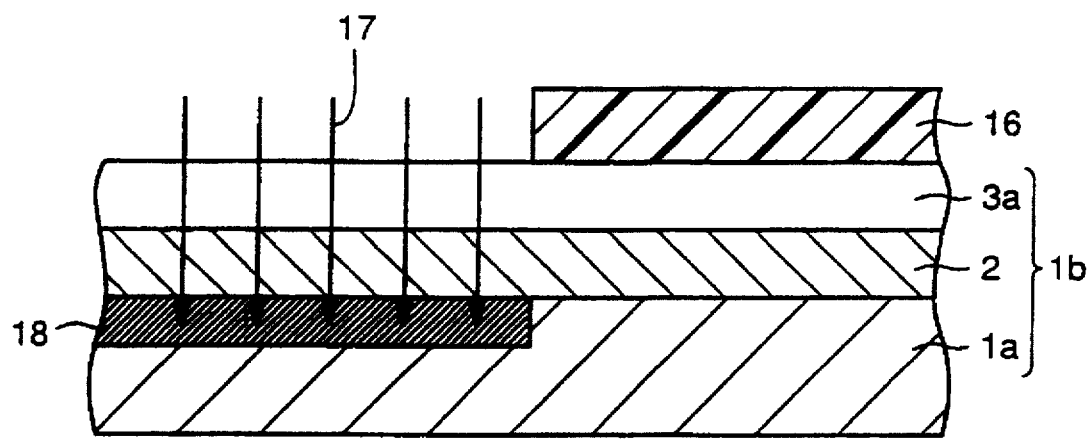

Referring to FIG. 11, a pattern of a resist film 16 is formed on a region other than an N-channel transistor forming region. Thereafter the resist film 16 is employed as a mask to ion-implant boron (B) 17 or the like from a direction perpendicular to the substrate surface at an injection rate of $10^{15}$ ions/cm$^2$. Due to such implantation of the boron 17, a P-type high-concentration impurity layer 18 having an impurity concentration of $10^{15}$ ions/cm$^3$ is formed immediately under the buried oxide film 2 up to a depth of about 3000Å from the upper surface of the semiconductor substrate 1a. Thereafter the resist film 16 is removed.

Figure 12:
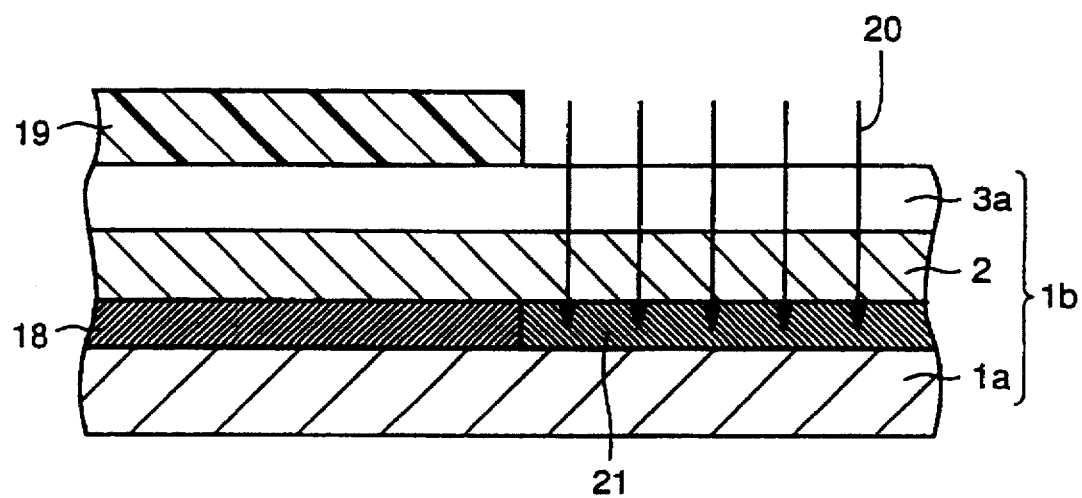

Referring to FIG. 12, a pattern of a resist film 19 is formed on a region other than a P-channel transistor forming region. The resist film 19 is employed as a mask to ion-implant arsenic (As) 20 from the direction perpendicular to the substrate 1a at an injection rate of $10^{15}$ ions/cm$^2$, thereby forming an N-type high-concentration impurity layer 21 having an impurity concentration of $10^{20}$ ions/cm$^3$ in a portion immediately under the buried oxide film 2 up to a depth of about 3000 Å from the upper surface of the semiconductor substrate 1a. Thereafter the resist film 19 is removed.

Figure 13:
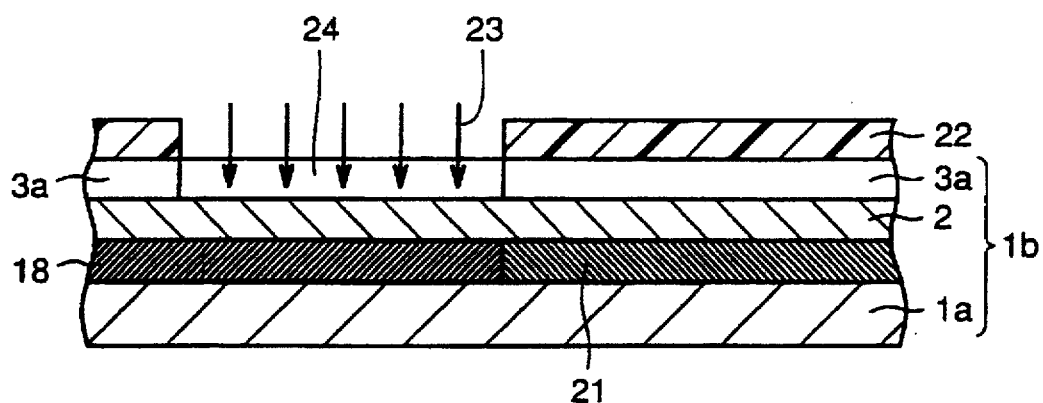

Referring to FIG. 13, a pattern of a resist film 22 is formed on the region other than the N-channel transistor forming region. Thereafter the resist film 22 is employed as a mask to implant arsenic (As) 23 from the direction perpendicular to the substrate 1a at an injection rate of $10^{15}$ ions/cm$^2$, thereby forming a P-type active region 24 of the N-channel transistor containing a P-type impurity. Thereafter the resist film 22 is removed.

Figure 14:
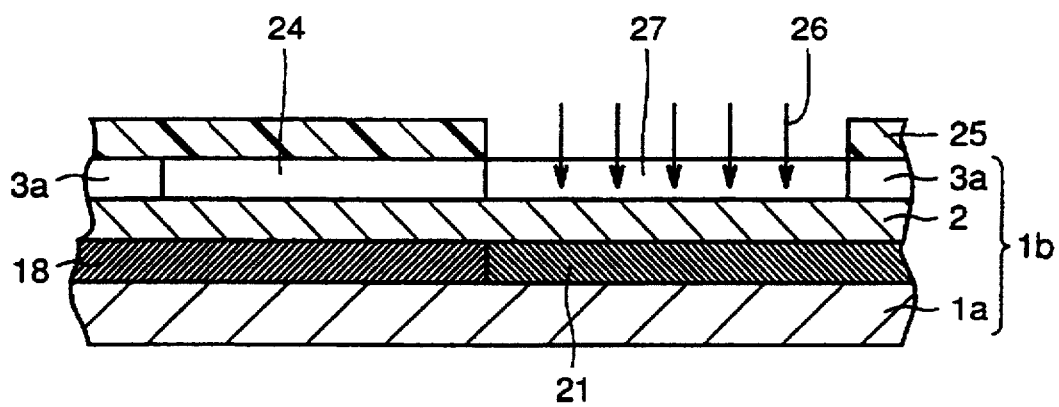

Referring to FIG. 14, a pattern of a resist film 25 is formed on the region other than the P-channel transistor forming region. Boron (B) 26 is ion-implanted from the direction perpendicular to the substrate 1a at an injection rate of $10^{15}$ ions/cm$^2$, thereby forming an N-type active region 27 of the P-channel transistor. Thereafter the resist film 25 is removed.

Figure 15:
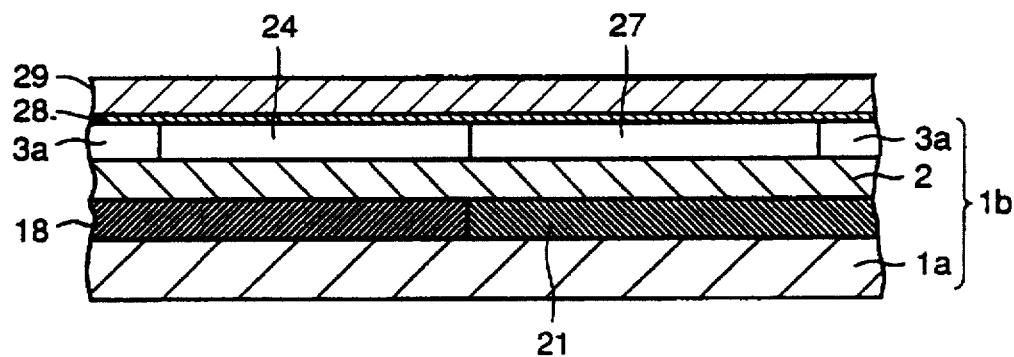

Referring to FIG. 15, the overall surface of the semiconductor device is oxidized, thereby forming an extremely thin underlayer oxide film 28 of about 100 to 200 Å in thickness. A silicon nitride film 29 for serving as a mask for field oxidation is deposited on the underlayer oxide film 28 by CVD (chemical vapor deposition), to have a thickness of about 3000 Å.

Thereafter a resist pattern (not shown) is formed through a photolithographic step to cover only the portion of the active regions 24 and 27. This resist pattern is employed as a mask to anisotropically etch the silicon nitride film 29. Thereafter the resist pattern is removed, thereby obtaining a pattern of the silicon nitride film 29 for serving as a mask in field oxidation.

Figure 16:
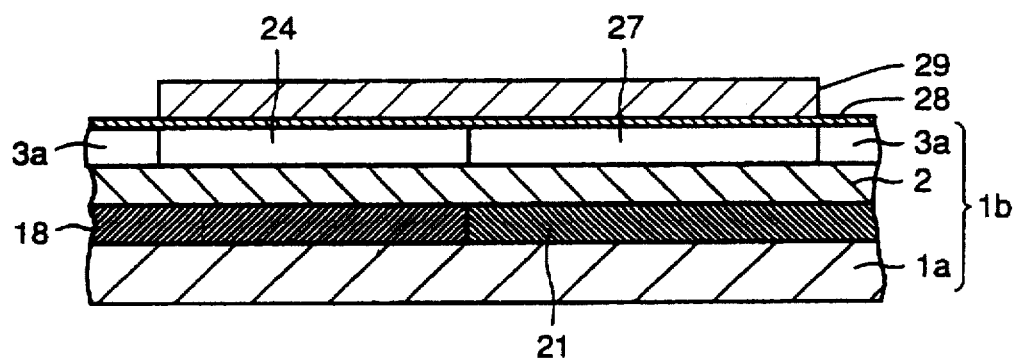
Figure 17:
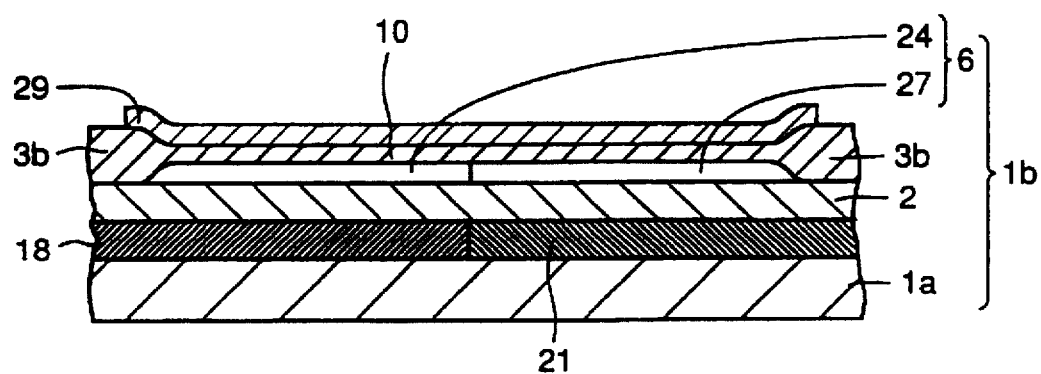

Referring to FIG. 17, the silicon nitride film 29 is employed as a mask to carry out field oxidation in an atmosphere containing hydrogen and oxygen at 950° C. for about 15 minutes, thereby forming a LOCOS isolation film 3b having the maximum thickness of about 2000Å. At this time, an end portion 10 of the LOCOS isolation film 3b is also formed on the already formed active regions 24 and 27, simultaneously with formation of the LOCOS isolation film 3b. Comparing FIGS. 16 and 17 showing the states before and after the field oxidation with each other, the active regions 24 and 27 are partially oxidized after the field oxidation and reduced in thickness due to conversion to the LOCOS isolation film 3b (or its end portion 10) or application of a pressure by the oxide film (10) as formed. Thereafter the silicon nitride film 29 is removed.

Figure 18:
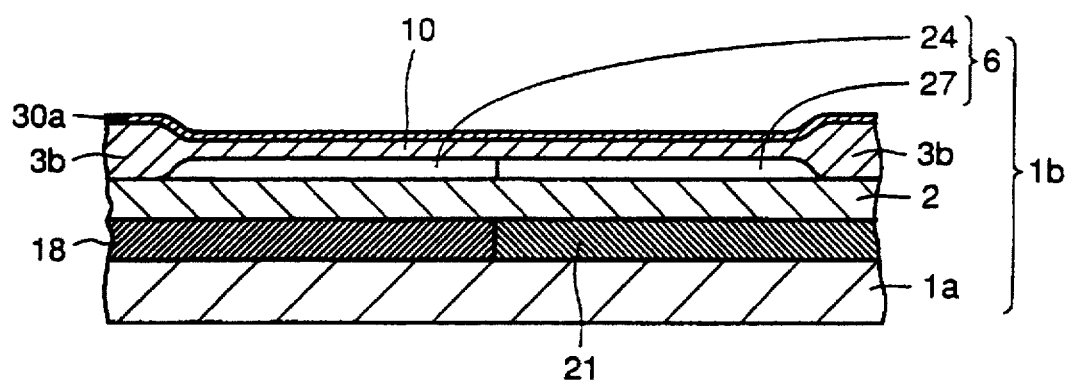

Referring to FIG. 18, silicon dioxide is then deposited on the semiconductor substrate 1a by CVD in a thickness of 100 to 200 Å, thereby forming an underlayer oxide film 30a.

Figure 19:
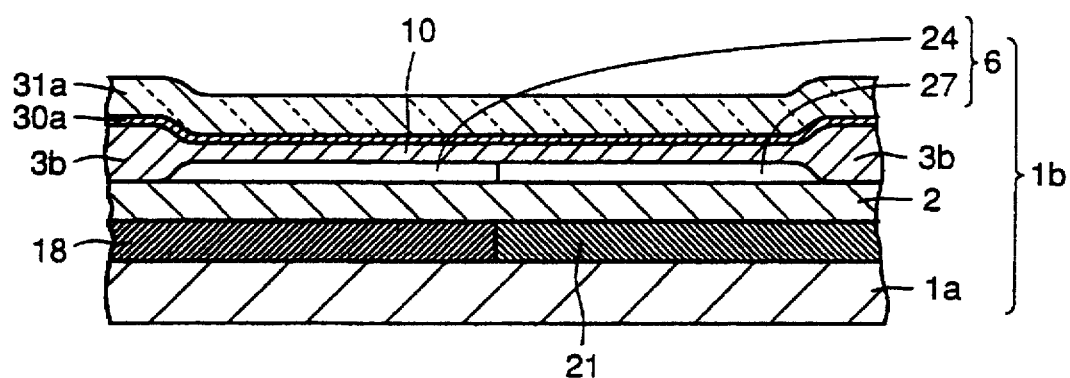

Referring to FIG. 19, polysilicon containing an impurity is deposited on the underlayer oxide film 30a by CVD, thereby forming a polysilicon layer 31a of about 2000 Å in thickness.

Figure 20:
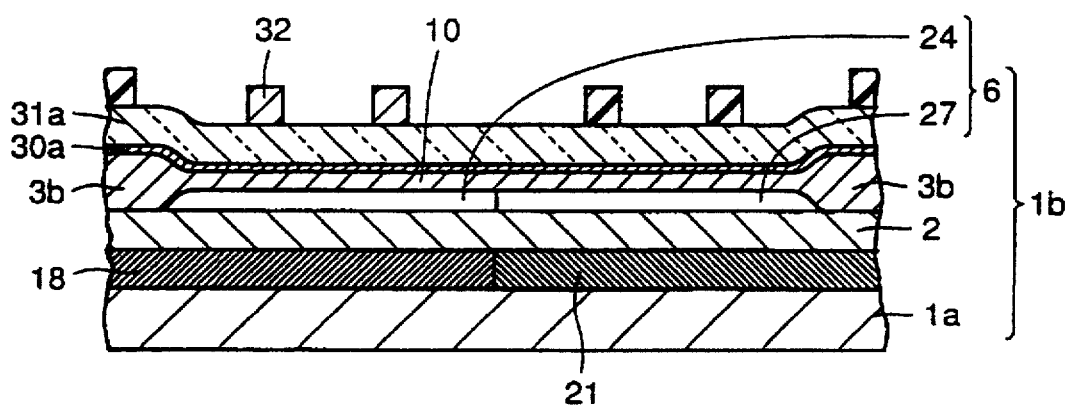

Referring to FIG. 20, patterns of resist films 32 having word line shapes are formed on the polysilicon layer 31a by photolithography.

Figure 21:
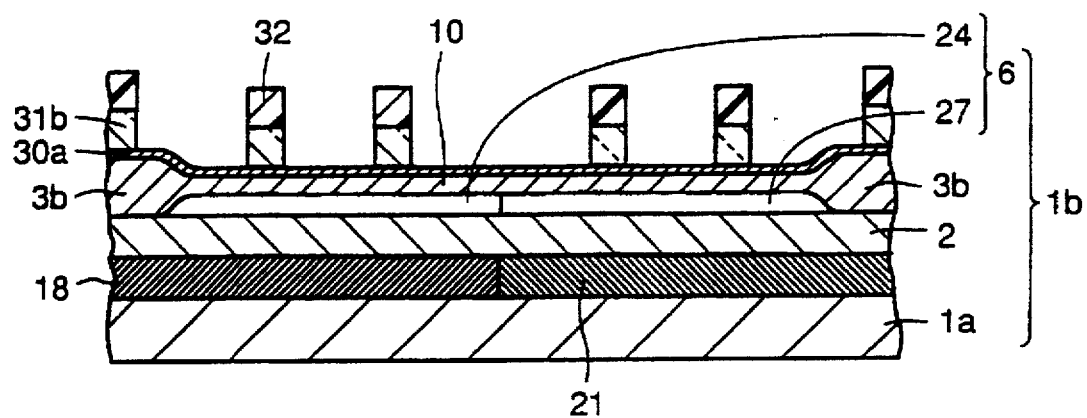

Referring to FIGS. 20 and 21, the resist films 32 are employed as masks to anisotropically etch the polysilicon layer 31a, thereby forming word lines 31b serving as gate electrodes. The word lines 31b are formed to be 5000 Å in width and 1000 Å in thickness. On the other hand, the gate insulating layer 30a is formed to be 100 to 200 Å in thickness.

Figure 22:
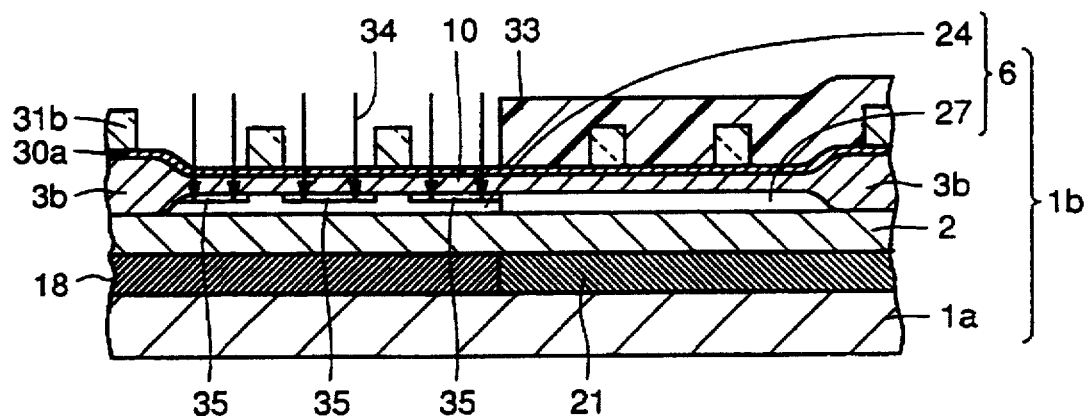

Referring to FIGS. 21 and 22, the resist films 32 are removed, and thereafter N-type low-concentration impurity layers 35 are formed in the N-channel transistor forming region, in order to form LDD (light doped drain) structures in the active region for defining source/drain regions of transistors. The N-type low-concentration impurity layers 35 are formed as follows: A resist film 33 is formed on the region other than the N-channel transistor forming region by photolithography. Thereafter the resist film 33 is employed as a mask to implant arsenic (As) 34 from the direction perpendicular to the substrate 1a, thereby forming the N-type low-concentration impurity layers 35. Then the resist film 33 is removed.

Figure 23:
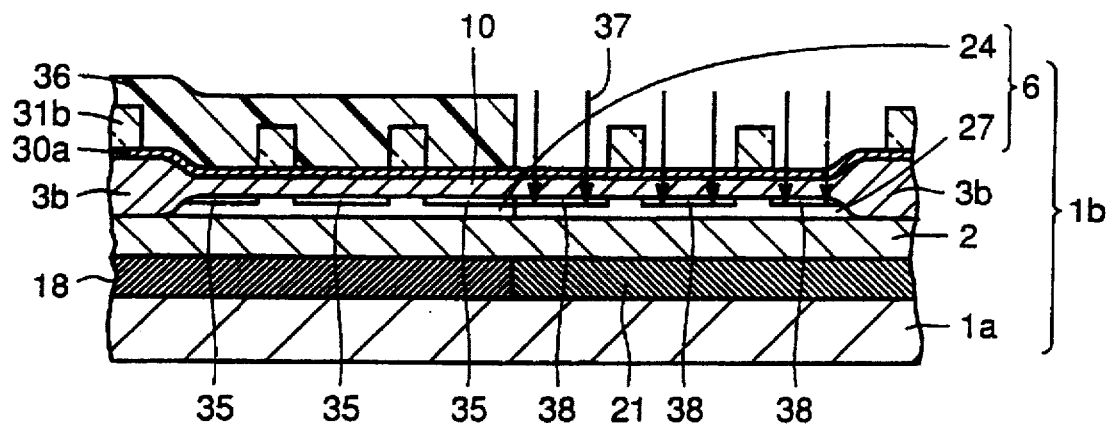

Referring to FIG. 23, a resist film 36 is formed on the region other than the P-channel transistor forming region by photolithography. The resist film 36 is employed as a mask to implant boron 37 from the direction perpendicular to the substrate 1a, thereby forming P-type low-concentration impurity layers 38. Thereafter the resist film 36 is removed.

Figure 24:
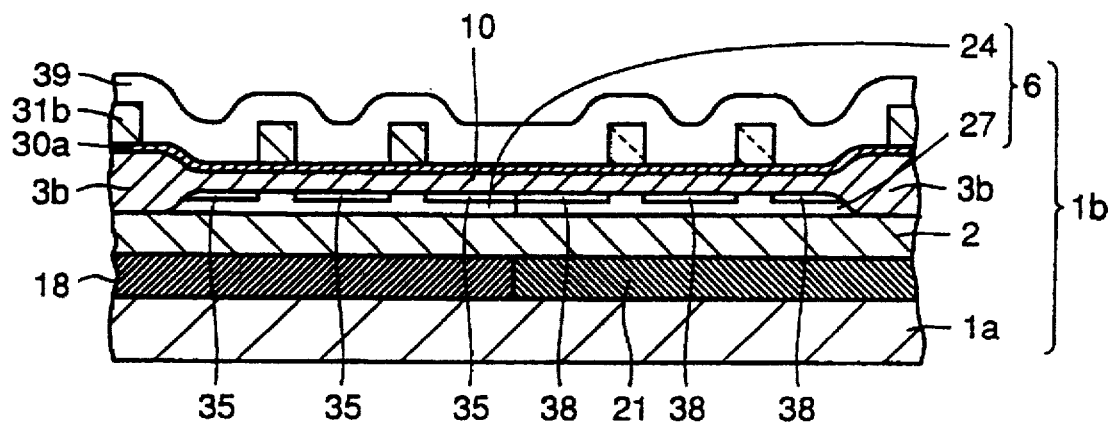

Referring to FIG. 24, an insulating film 39, consisting of silicon dioxide, of at least 2000 Å in thickness is formed on the semiconductor substrate 1a by CVD, to cover the word lines 31b.

Figure 25:
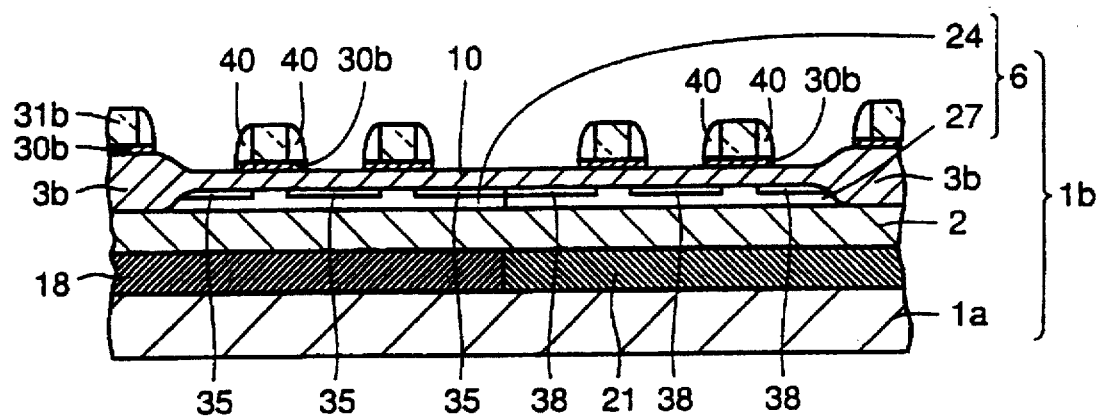

Referring to FIGS. 24 and 25, the insulating layer 39 is anisotropically etched back to form side wall spacers 40 on side walls of the word lines 31b. At this time, the underlayer oxide film 30a is also etched, to be left as gate insulating films 30b only under the word lines 31b.

Figure 26:
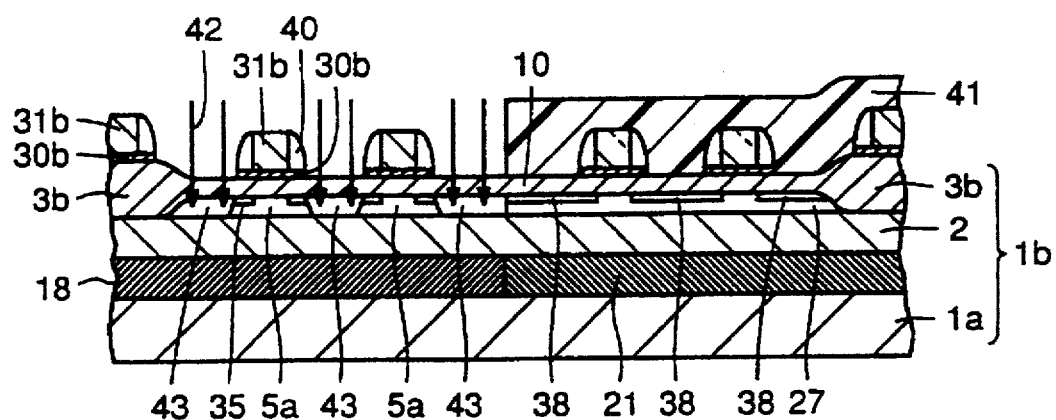

Referring to FIG. 26, a resist film 41 is formed on the region other than the N-channel transistor forming region by photolithography. The resist film 41 is employed as a mask to implant arsenic (As) 42 from the direction perpendicular to the substrate 1a at an injection rate of $10^{15}$ ions/cm$^2$, thereby forming N-type high-concentration impurity layers 43 of about $10^{20}$ ions/cm$^3$. Then the resist film 41 is removed.

Figure 27:
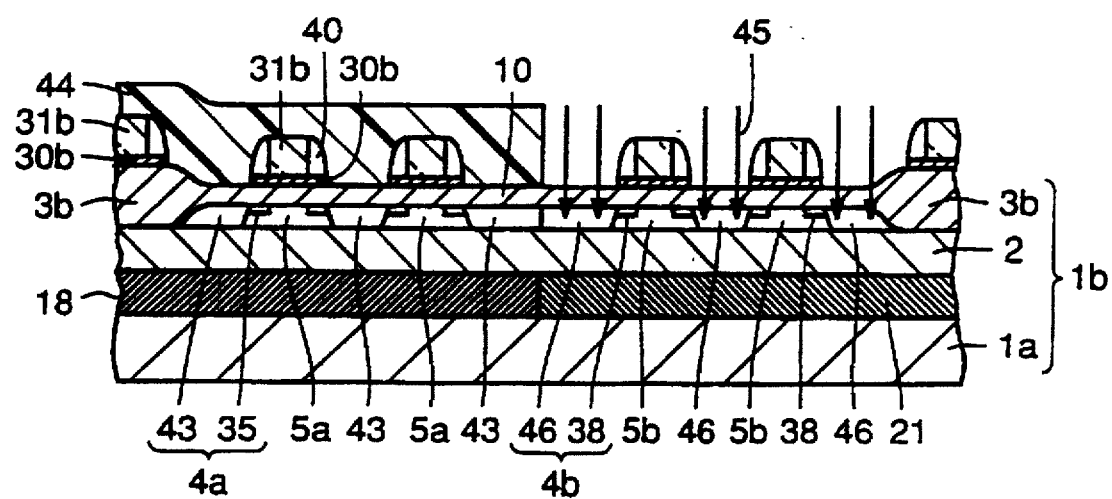

Referring to FIG. 27, a pattern of a resist film 44 is formed on the region other than the P-channel transistor forming region by photolithography. The resist film 44 is employed as a mask to implant boron (B) 45 from the direction perpendicular to the substrate 1a at an injection rate of $10^{15}$ ions/cm$^2$, thereby forming P-type high-concentration impurity layers 46 of about $10^{20}$ ions/cm$^3$ in concentration.

Thus, LDD structure source/drain regions 4a and 4b of the N-channel and P-channel transistors are formed. Further, a thin-film SOI-MOSFET (not shown) having normal dimensions and a parasitic SOI-MOSFET including the end portion 10 of the LOCOS isolation film 3b are formed in the active regions.

Figure 28:
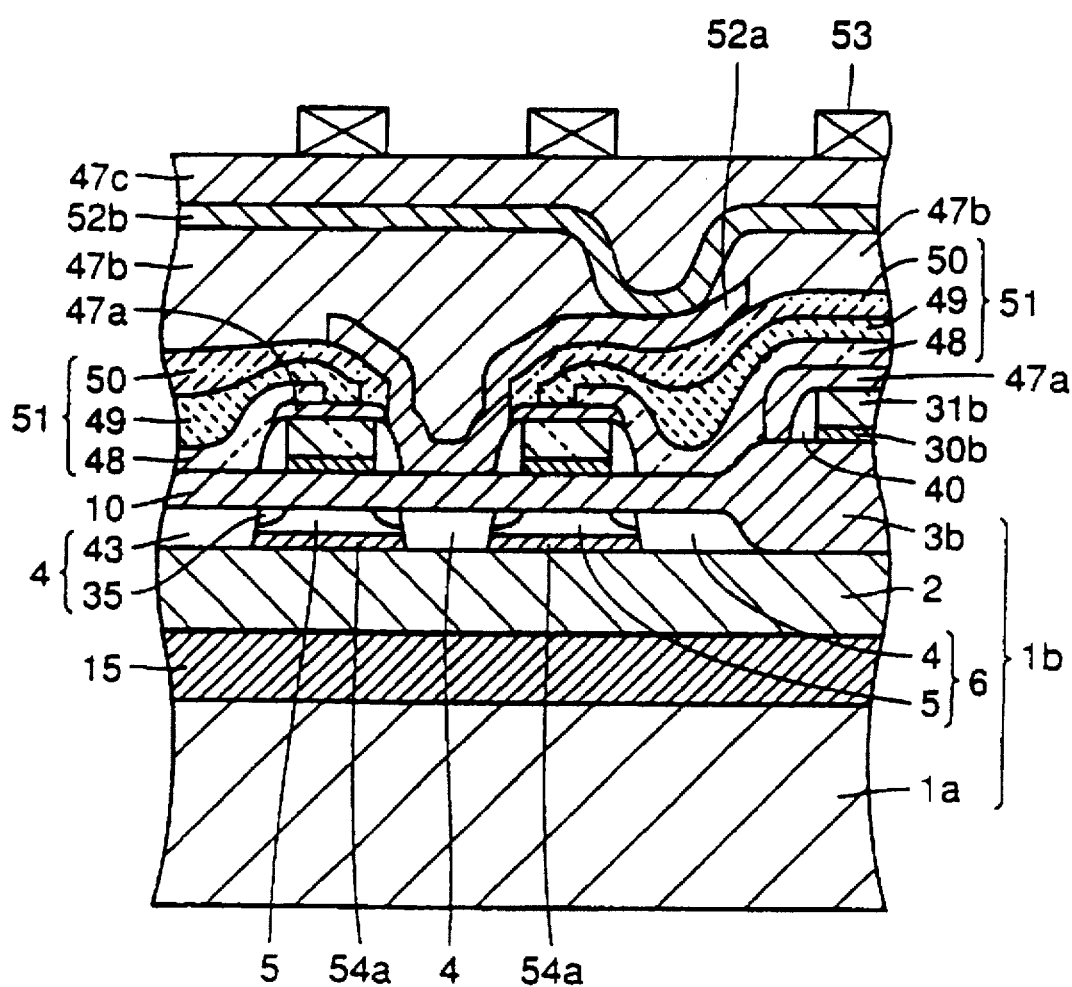

With reference to FIG. 28, a case of forming memory cells of a DRAM is described. For the purpose of simplification, the following description is made only with reference to the N-channel transistor forming region. First, the word lines 31b are covered with insulating layers 47a. Natural oxide films formed on the high-concentration impurity layers 43 which are parts of the source/drain regions 4a are removed by dry etching, thereby exposing surfaces of the source/drain regions 4a (this step is not shown in the sectional view of FIG. 28). Capacitors consisting of storage nodes 48, high dielectric layers 49 and cell plates 50 are formed on the semiconductor substrate 1a, to be in contact with the source/drain regions 4a(portions where the source/drain regions 4a and the storage nodes 48 are in contact with each other are not shown in FIG. 28). Then, a polypad 52a is formed on the semiconductor substrate 1a. An insulating layer 47b is formed on the semiconductor substrate 1a, to cover the capacitors 51 and the polypad 52a. A contact hole is formed in the insulating layer 47b, to partially expose a surface of the polypad 52a. A bit line 52b is formed on the semiconductor substrate 1a to be connected with the polypad 52a through the contact hole. An insulating layer 47c is formed on the semiconductor substrate 1a, to cover the bit line 52b. Metal wires 53 are formed on the insulating layer 47c, thereby completing the DRAM.

According to this embodiment, the high-concentration impurity layer 15 is formed along the overall surface of the region forming the SOI substrate 1b, as shown in FIGS. 6, 7 and 8. Namely, the high-concentration impurity layer 15 is formed also in a portion other than the region (see FIG. 8) provided with the parasitic SOI-MOSFET, i.e., under the thin-film SOI-MOSFET having correct dimensions. A drain current flowing in the parasitic SOI-MOSFET is extremely smaller than that of the thin-film SOI-MOSFET which is formed in normal dimensions, as understood from a value which is saturated by increasing a gate voltage. When there are two transistors which are fed with currents having extremely different values, different influences are exerted by voltages which are applied to portions corresponding to back gates, as a matter of course. Namely, the parasitic SOI-MOSFET is remarkably influenced by the back gate voltage. On the other hand, the thin-film SOI-MOSFET having normal dimensions is hardly influenced by a back potential dissimilarly to the parasitic SOI-MOSFET, due to an extremely large value of a current flowing across its source/drain regions. Therefore, the threshold value of the transistor itself is not remarkably fluctuated even if a weak inversion region is formed in a lower portion of the channel region. Consequently, the semiconductor device has stable electrical properties.

Embodiment 2

Figure 29:
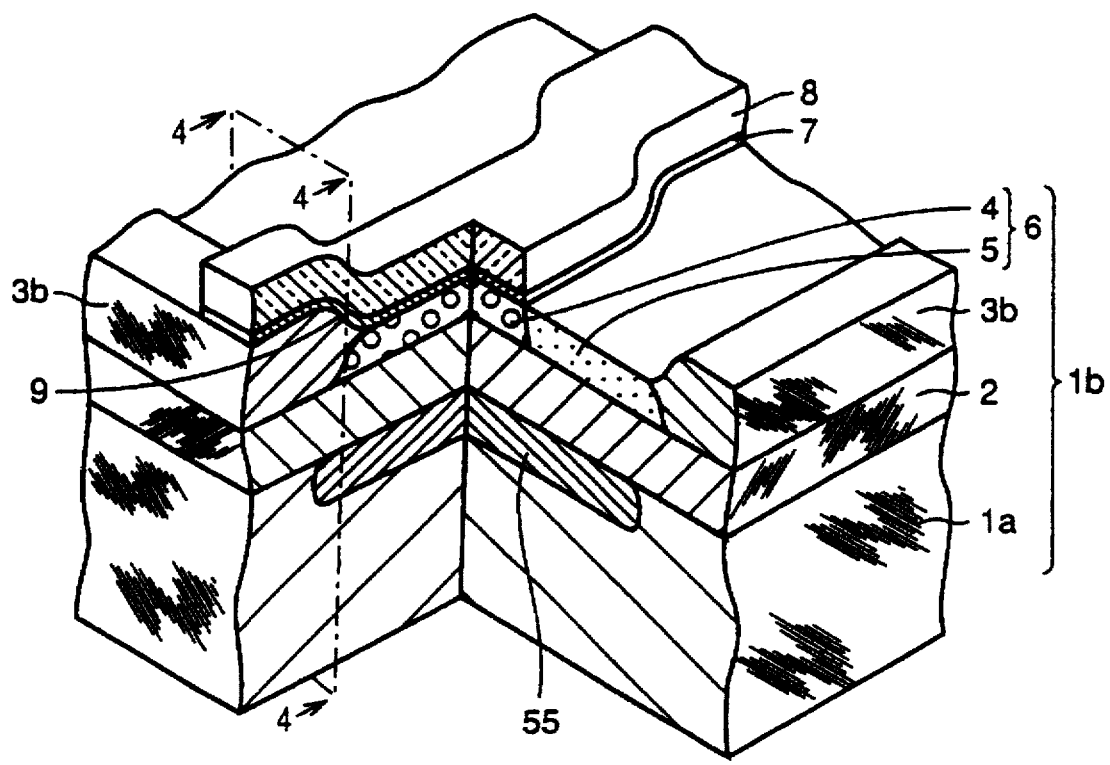
FIG. 29 is partially fragmented perspective view of a semiconductor device according to an embodiment 2 of the present invention.

FIG. 29 is a partially fragmented perspective view showing a semiconductor device according to an embodiment 2 of the present invention. The semiconductor device shown in FIG. 29 is identical to the prior art shown in FIG. 2 except the following point, and hence portions identical or corresponding to those of the conventional device are denoted by the same reference numerals, to omit redundant description.

The semiconductor device shown in FIG. 29 is different from that shown in FIG. 2 in a point that a high-concentration impurity layer 55 containing an impurity of the same type as source/drain layers 4 is formed under an active region which is provided with a thin-film SOI-MOSFET, immediately under a buried oxide film 2.

While the high-concentration impurity layer 15 is formed along the overall surface of the region forming the SOI substrate 1b in the embodiment 1, no high-concentration impurity layer is formed in a portion provided with a LOCOS isolation film, i.e., an inactive region, in the embodiment 2. In the embodiment 2, however, the high-concentration impurity layer 55 is formed in a lower portion of a parasitic SOI-MOSFET which is formed in a boundary portion between the active and inactive regions, whereby difference between work functions of an SOI layer 6 and the high-concentration impurity layer 55 which are formed in upper and lower portions with interposition of the buried oxide film 2 is increased. Thus, a weak inversion region is formed in a lower portion of a channel layer of the parasitic SOI-MOSFET. Consequently, a state of applying a negative potential to a back gate of a MOSFET, having no SOI structure, which is directly formed on a semiconductor substrate is attained. Therefore, it is possible to increase the threshold value of the parasitic SOI-MOSFET, to eliminate an influence exerted by a hump current which is caused by the parasitic SOI-MOSFET and to extremely reduce an OFF-state current, whereby electrical properties of the transistor are stabilized. A method of fabricating the semiconductor device shown in FIG. 29 is now described with reference to sectional views taken along the line 4—4.

Figure 30:
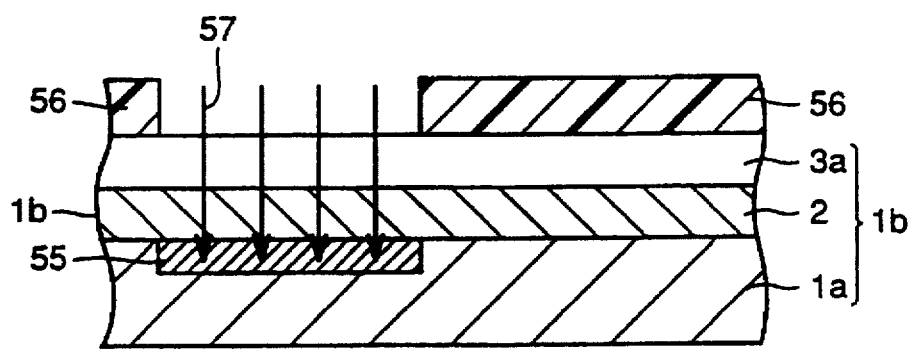
FIGS. 30 to 32 are sectional views successively showing steps of a method of fabricating the semiconductor device according to the embodiment 2.

Referring to FIG. 30, an SOI substrate 1b is formed similarly to the embodiment 1. A resist pattern 56 is formed on a region other than an N-channel transistor forming region by photolithography. Boron (B) ions 57, which are P-type impurity ions, are implanted from a direction perpendicular to the substrate 1b at an injection rate of $10^{15}$ ions/cm$^2$, thereby forming a P-type high-concentration impurity layer 55 in an upper portion of a semiconductor substrate 1a immediately under the buried oxide film 2. Then the resist pattern 56 is removed.

Figure 31:
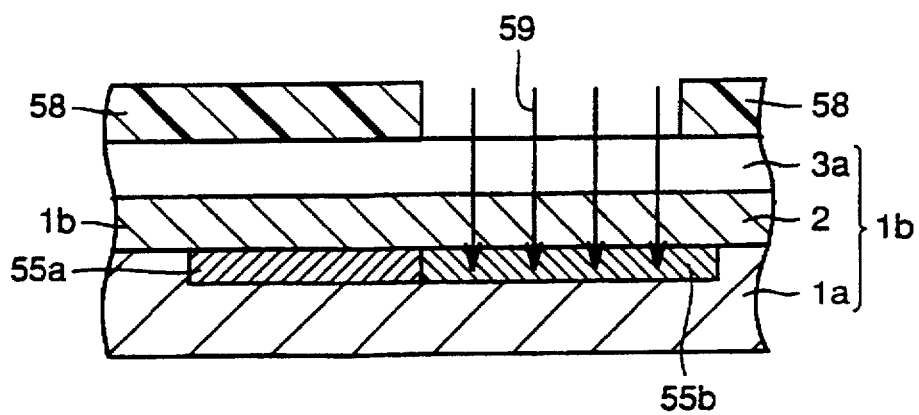
Figure 32:
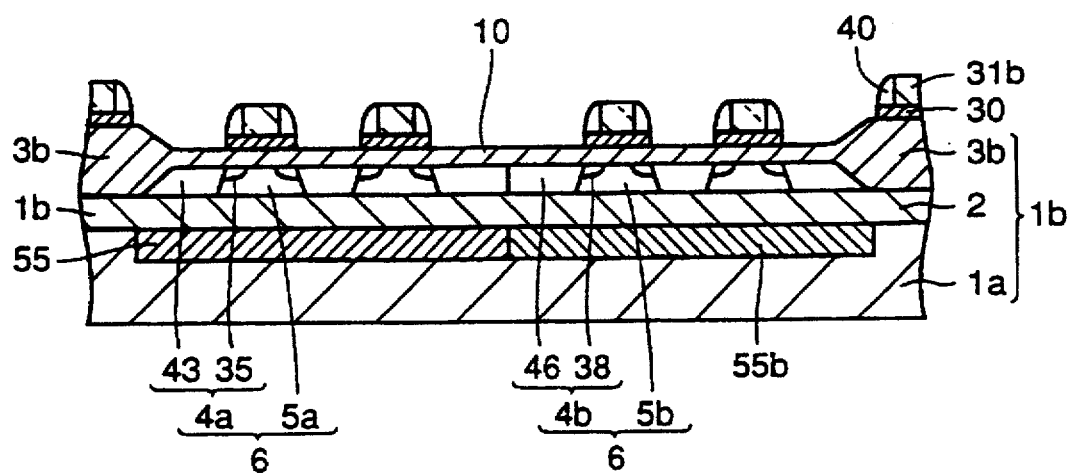

Referring to FIG. 31, a resist pattern 58 is formed on a region other than a P-channel transistor forming region. The resist pattern 58 is employed as a mask to implant arsenic (As) ions 59, which are N-type impurity ions, from the direction perpendicular to the substrate 1a, thereby forming an N-type high-concentration impurity layer 55b in an upper portion of the semiconductor substrate 1a. The high-concentration impurity layers 55a and 55b as formed are about $10^{20}$ ions/cm$^3$ in concentration.

Thereafter a thin-film SOI-MOSFET including gate electrodes 31b is formed in a similar manner to the embodiment 1, thereby obtaining the semiconductor device shown in FIG. 30.

While the high-concentration impurity layer 55 is formed in advance of formation of a LOCOS isolation film 3b and the SOI layer 6 in the embodiment 2 as shown in FIG. 30, the present invention is not restricted to this. Alternatively, the high-concentration impurity layer 55 may be formed by adjusting the ion implantation energy and the ion injection rate in impurity ion implantation for forming source/drain layers in the SOI layer 6. According to this method, it is possible to simplify the photolithographic step for forming the resist pattern and the step of removing the resist film.

Similarly to the above description with reference to the embodiment 1, the impurity forming the high-concentration impurity layer is preferably of the P type when the thin-film SOI-MOSFET formed thereon is an N-channel transistor, while the same is preferably of the N type when the thin-film SOI-MOSFET is formed by a P-channel transistor. It may also be necessary to employ still another combination, i.e., to form an N-type high-concentration impurity layer in a lower portion of an N-channel transistor, in order to bring the threshold value of the parasitic SOI-MOSFET to a desired level.

Embodiment 3

Figure 33:
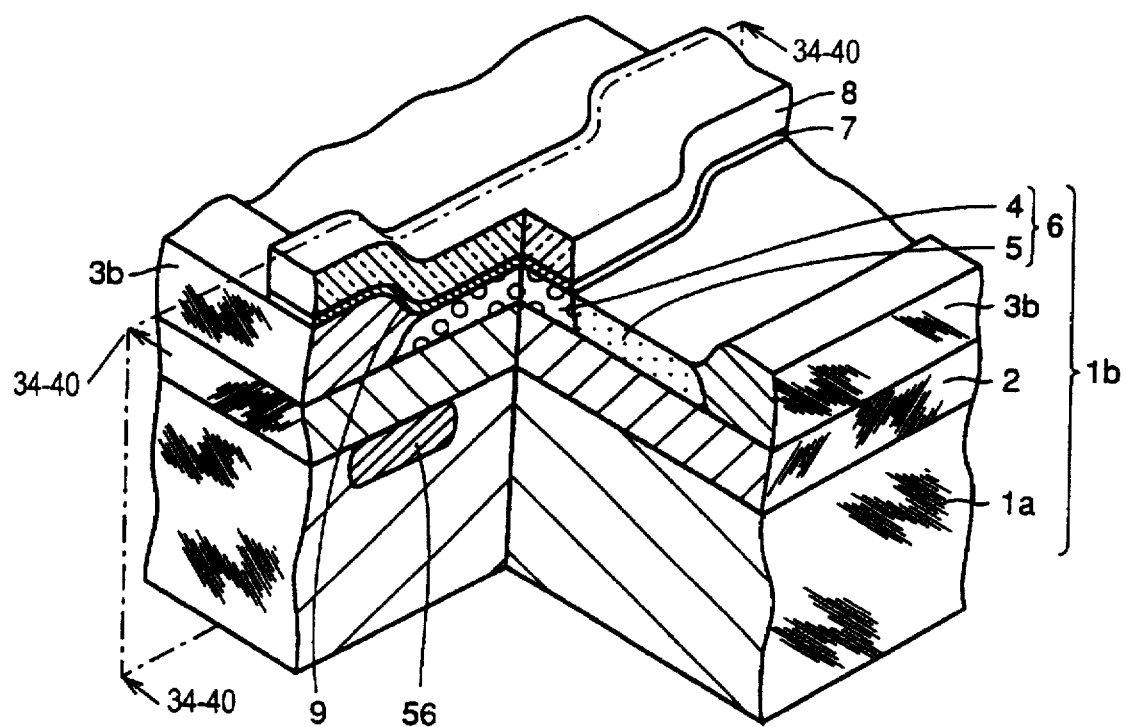
FIG. 33 is partially fragmented perspective view of a semiconductor device according to an embodiment 3 of the present invention.

FIG. 33 is a partially fragmented perspective view showing a semiconductor device according to an embodiment 3 of the present invention. The semiconductor device shown in FIG. 33 is identical to that shown in FIG. 29 except the following point, and hence portions identical or corresponding to those shown in FIG. 29 are denoted by the same reference numerals, to omit redundant description. The semiconductor device according to the embodiment 3 is different from that according to the embodiment 2 in a point that a high-concentration impurity layer 56 is formed only under a boundary portion between a LOCOS isolation film 3b and an SOI layer 6. The high-concentration impurity layer 56 is of the N or P type. In the semiconductor device according to the embodiment 3, the high-concentration impurity layer 56 is formed under a position where a parasitic SOI-MOSFET is formed. Due to difference between work functions of the high-concentration impurity layer 56 and a channel region 5 which are formed in lower and upper portions with interposition of a buried oxide film 2, it is possible to form a weak inversion region in a lower portion of the channel layer 5. Thus, an effect which is similar to those of the embodiments 1 and 2 can be attained, thereby increasing the threshold value of the parasitic SOI-MOSFET. Consequently, it is possible to suppress a hump current and reduce an OFF-state current, thereby providing a semiconductor device having stable electric properties.

The conductivity type of the impurity which is contained in the high-concentration impurity layer 56 is now described. When the high-concentration impurity layer 56 is prepared from a P-type impurity when an N-channel transistor is formed, the threshold value is increased, while the threshold value is reduced when the high-concentration impurity layer 56 is prepared from an N-type impurity. Inverse results are obtained in case of a P-channel transistor. Due to such characteristics, a transistor having various properties can be obtained by properly changing the ion species contained in the high-concentration impurity layer 56 and its concentration, in a device requiring a characteristic electrical property of having a hump current.

A method of fabricating the semiconductor device according to the embodiment 3 shown in FIG. 33 is now described with reference to sectional views taken along the line 34-40—34-40.

Figure 34:
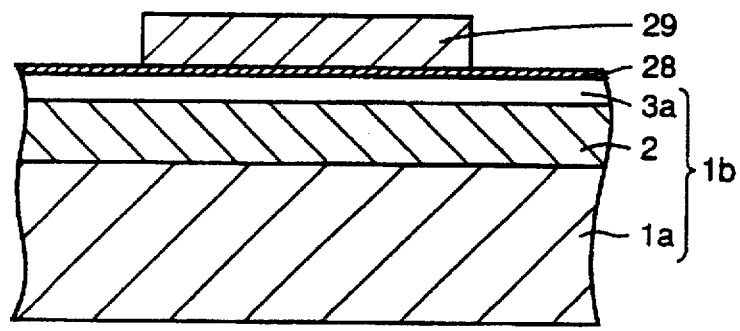
FIGS. 34 to 37 are sectional views successively showing steps of a method of fabricating the semiconductor device according to the embodiment 3.

Referring to FIG. 34, an SOI substrate 1b consisting of a semiconductor substrate 1a (P-type), a buried oxide film 2 and a silicon layer 3a is formed, similarly to the embodiment 1.

Thereafter an underlayer oxide film 28 of 100 to 200 Å in thickness is formed by heat treating the overall upper surface of the silicon layer 3a or through film formation by CVD. A silicon nitride film 29 of 3000 Å in thickness is formed on the underlayer oxide film 28 and patterned by photolithography to be left only on a region serving as an active region, thereby forming a pattern of the silicon nitride film 29.

Figure 35:
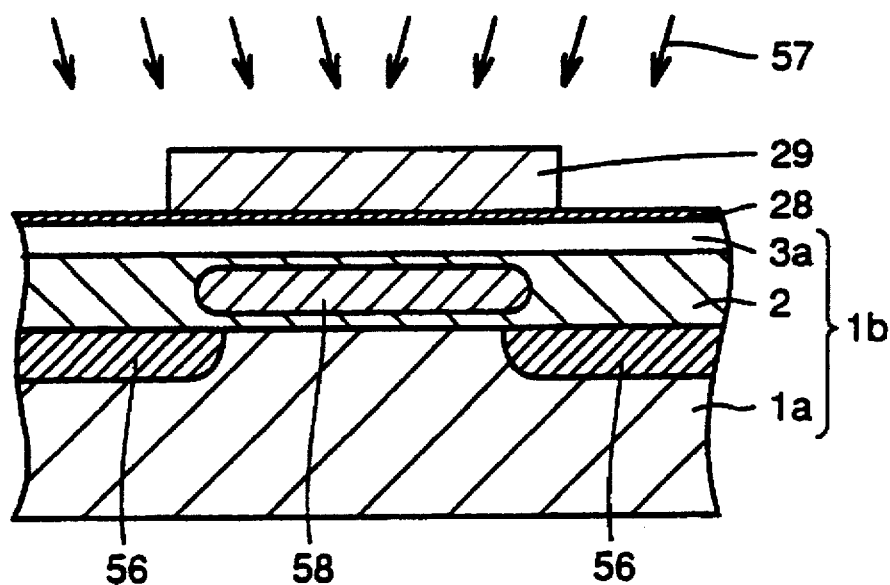

Referring to FIG. 35, boron (B) which is a P-type impurity or arsenic (AS) which is an N-type impurity 57 is rotationally ion-implanted into the SOI substrate 1b at an angle of about 30° with respect to the vertical direction. This ion implantation is made at an ion injection rate of $10^{15}$ ions/$cm^2$, so that high-concentration impurity layers 56 formed by this ion implantation are about $10^{20}$ ions/$cm^3$ in impurity concentration. At this time, the impurity ions are also implanted into the buried oxide film 2 located under the silicon nitride film 29 to form an impurity implantation layer 58, since the silicon nitride film 29 is partially formed on the SOI substrate 1b in a large thickness. However, the impurity implantation layer 58, which is formed in an insulating substance, exerts absolutely no electrical influence on other regions. Thus, no problem is caused by the impurity implantation layer 58.

Figure 36:
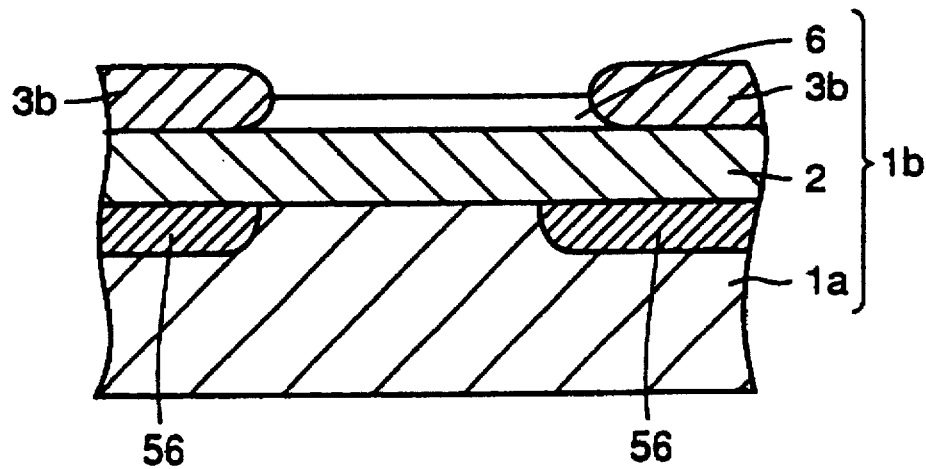
Figure 37:
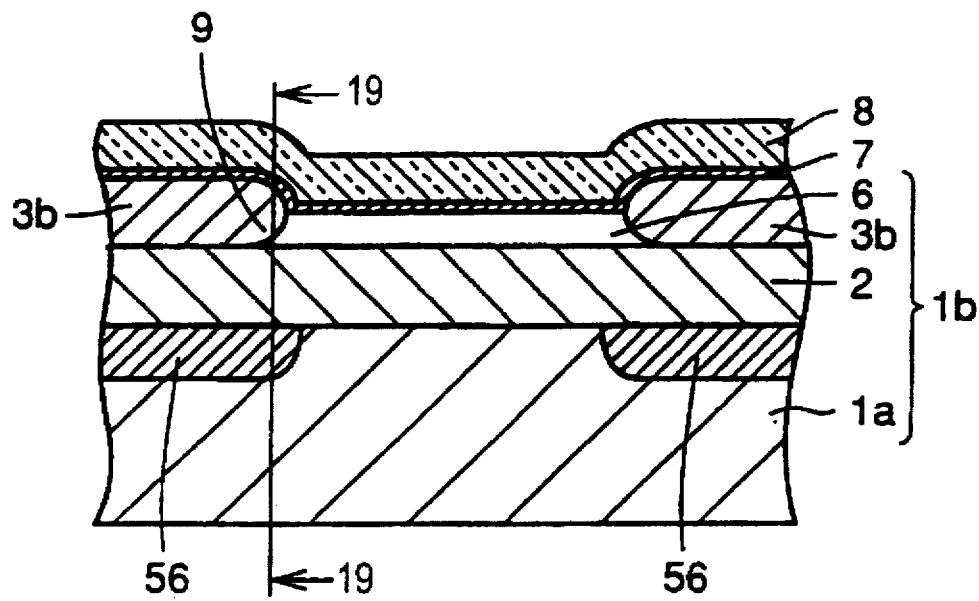

This impurity implantation layer 58 is omitted from FIGS. 36 and 37, in order to simplify the illustration.

Referring to FIGS. 35 and 36, the silicon nitride film 29 is employed as a mask to perform heating in an atmosphere containing hydrogen and oxygen at 950° C. for about 15 minutes, thereby forming LOCOS isolation films 3b having maximum thicknesses of 2000 Å. At this time, a part of the silicon layer 3a located under the silicon nitride film 29 and not oxidized by such field oxidation defines the active region in a self-alignment manner. Thereafter the silicon nitride film 29 and the underlayer oxide film 28 are removed.

Referring to FIG. 37, an insulating layer 7, consisting of silicon dioxide, having a thickness of about 100 to 2000 Å is formed by CVD, and a word line (gate electrode) 8 of about 2000 Å in thickness is further formed by CVD. At this time, a section of a portion provided with a parasitic SOI-MOSFET, i.e., a section taken along the line 19—19 in FIG. 37, is similar to that shown in FIG. 19.

Thereafter treatment similar to that of the embodiment 1 is carried out, to obtain the semiconductor device shown in FIG. 33.

While the LOCOS isolation films 3b are formed after formation of the high-concentration impurity layers 56 in the aforementioned method, the latter may be formed after formation of the former.

Figure 38:
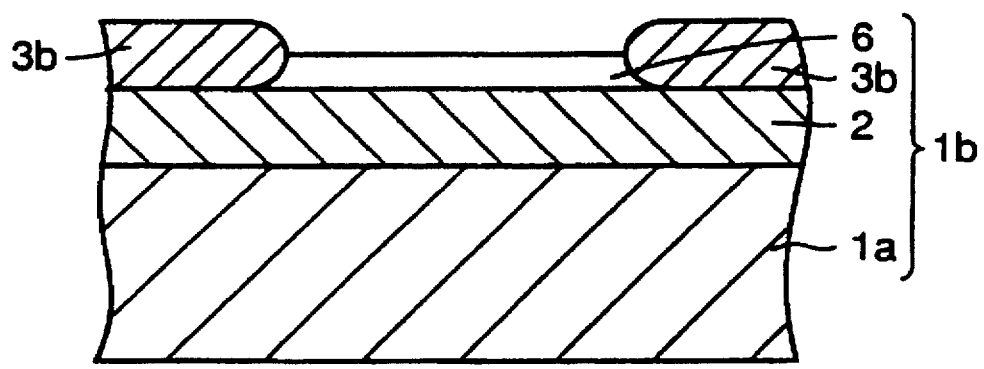
FIGS. 38 to 40 are sectional views successively showing steps of another method of fabricating the semiconductor device according to the embodiment 3.
Figure 39:
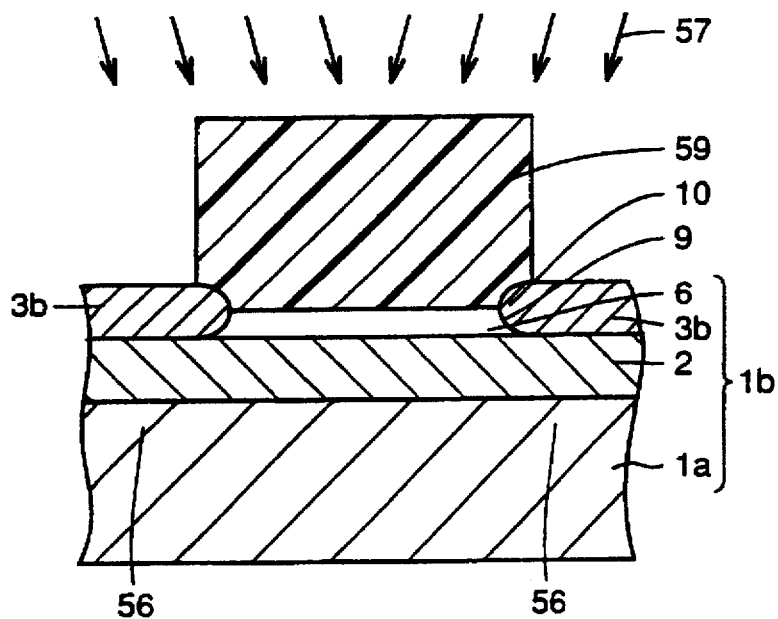

The semiconductor device according to the embodiment 3 may alternatively formed by the following method:

Referring to FIG. 38, an SOI substrate 1b is first formed. Then, LOCOS isolation films 3b and an SOI layer 6 are formed. Referring to FIG. 39, a pattern of a resist film 59 having a thickness of about 10000 Å is formed on the SOI layer 6 and end portions 10 of the LOCOS isolation films 3b. The resist film 59 is employed as a mask to implant impurity ions 57 by rotational ion implantation, thereby forming high-concentration impurity layers 56 in a semiconductor substrate 1a immediately under a buried oxide film 2. A semiconductor device having a similar structure to the aforementioned one can also be obtained by such a method.

Figure 40:
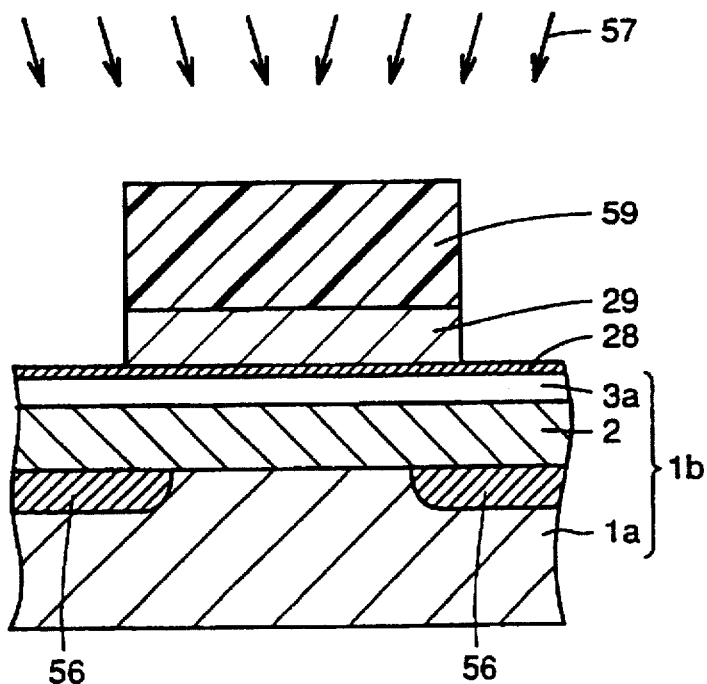

In the method of first forming the LOCOS isolation films 3b and thereafter forming the high-concentration impurity layers 56, the steps can be simplified through the following means:

Referring to FIG. 40, a mask which is necessary for selectively implanting impurity ions is formed by a film having a two-layer structure of a silicon nitride film 29 and a resist film 59. Thus, it is not necessary to remove the resist film 59 or the silicon nitride film 29 every step of field oxidation and impurity ion implantation, whereby the steps are effectively simplified.

Embodiment 4

Figure 41:
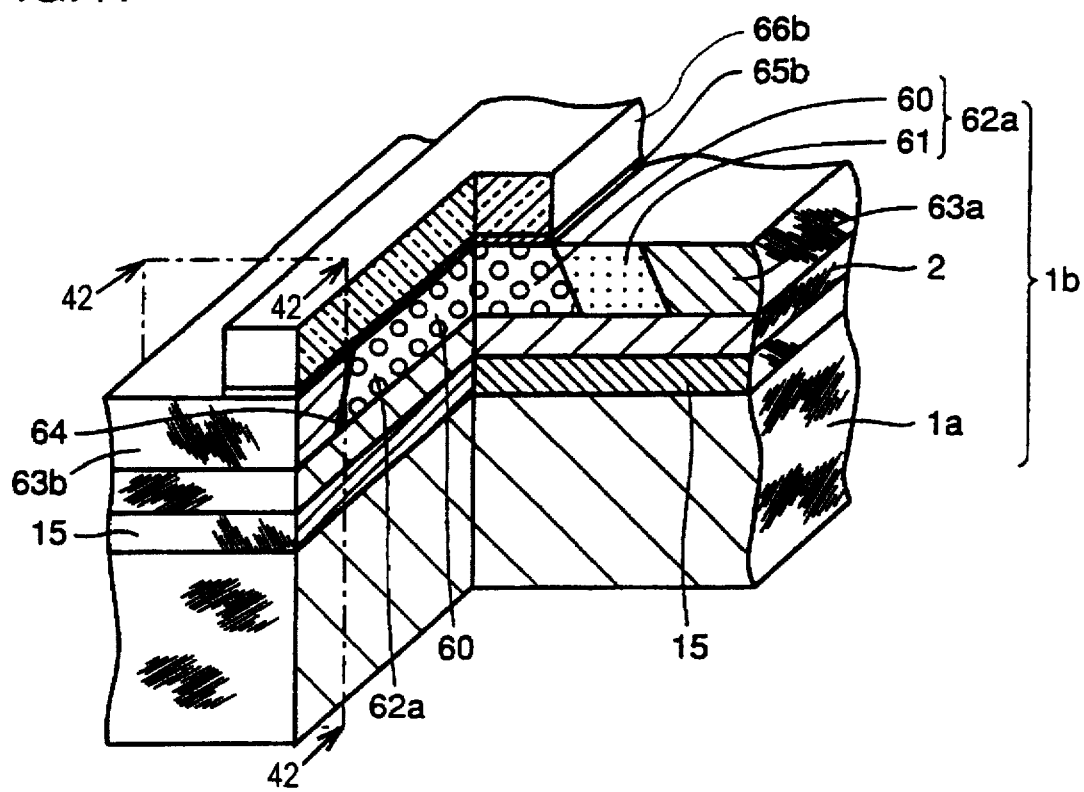
FIG. 41 is a partially fragmented perspective view of and a semiconductor device according to an embodiment 4 of the present invention.

FIG. 41 is a partially fragmented perspective view showing a semiconductor device according to an embodiment 4 of the present invention. While the embodiments 1 to 3 have been described with reference to planar transistors, the semiconductor device according to the embodiment 4 is different from that of the embodiment 1 in a point that a mesa transistor is formed in an SOI substrate 1b.

Referring to FIG. 41, the mesa transistor consists of a gate electrode 66b, a gate oxide film 65b, a channel layer 60, and source/drain layers 61. Insulating layers 63a and 63b are adapted to electrically isolate an active region from other active regions. A high-concentration impurity layer 15 is provided immediately under a buried insulating film 2.

Figure 42:
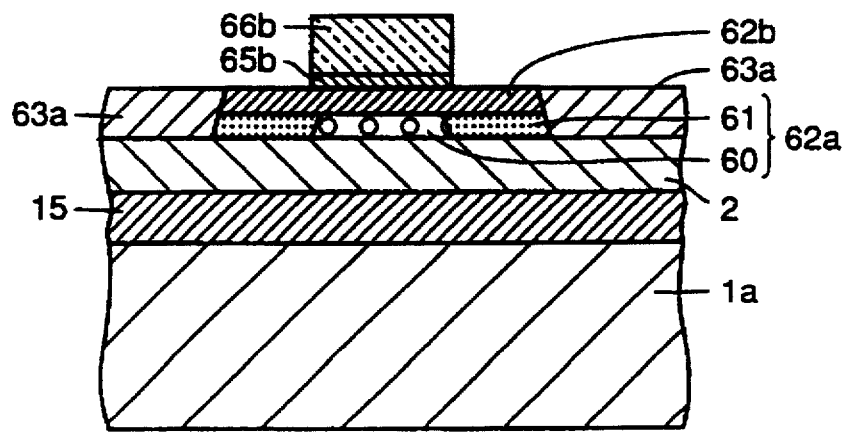
FIGS. 42 to 50 are sectional views successively showing steps of a method of fabricating the semiconductor device according to the embodiment 4.

FIG. 42 is a sectional view taken along the line 42—42 in FIG. 41, showing a portion provided with a parasitic SOI-MOSFET.

An active layer 62a of the mesa transistor is generally formed by anisotropically etching a silicon layer containing impurity atoms. While it is theoretically conceivable that side wall surfaces of the active layer 62a are perpendicular to the SOI substrate 1b upon such anisotropic etching of the silicon layer, an upper portion of the layer to be etched is easy to etch and a lower portion is hard to etch in practice. Therefore, a gate electrode (word line) 66b and the active layer 62a have upwardly tapered trapezoidal sections, as shown in FIG. 42.

Such a mesa transistor is also provided with a parasitic SOI-MOSFET, as shown in FIG. 42.

Electrical properties of this parasitic SOI-MOSFET have a hump current and a large OFF-state current when no high-concentration impurity layer 15 is provided immediately under the buried oxide film 2. However, it is possible to change only the threshold value of the parasitic SOI-MOSFET by preparing the high-concentration impurity layer 15 from a P-type impurity in case of an N-channel transistor while preparing the same from an N-type impurity in case of a P-channel transistor. Consequently, it is possible to obtain a transistor having stable electrical properties.

A method of fabricating the semiconductor device shown in FIG. 41 is now described with reference to sectional views taken along the line 42—42.

Figure 43:
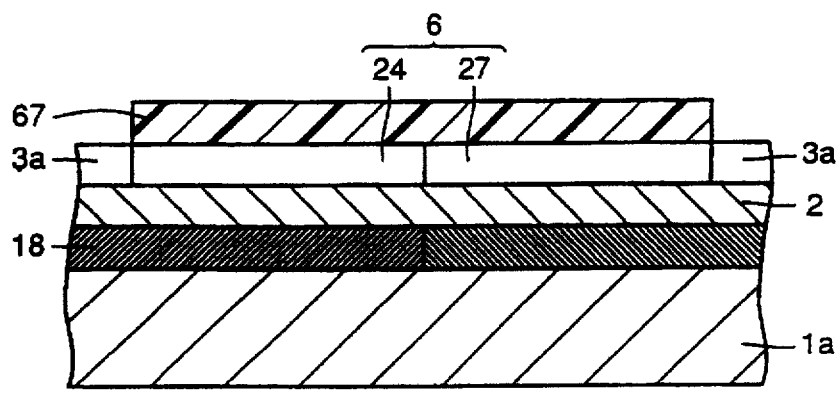

Referring to FIG. 43, an SOI substrate 1b consisting of a silicon layer 3a, a buried oxide film 2 and a semiconductor substrate 1a is prepared. Impurity ions are implanted into the SOI substrate 1b immediately under the buried oxide film 2, thereby forming P-type and N-type high-concentration impurity layers 18 and 21 under N-channel and P-channel transistor forming regions respectively. Thereafter active layers 24 and 27 including source/drain layers and channel layers are formed respectively. A resist pattern 67 is formed on the active layers 24 and 27.

Figure 44:
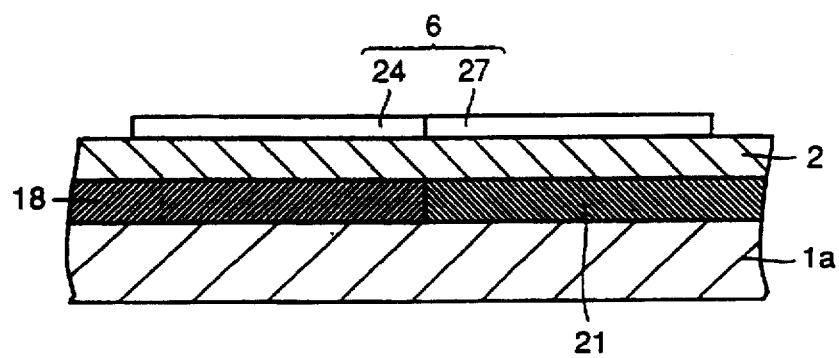

Referring to FIGS. 43 and 44, the resist pattern 67 is employed as a mask to anisotropically etch the silicon layer 3a, thereby forming a pattern of an active layer 6.

The active layers 24 and 27 shown in FIG. 44 are reduced in thickness to about ½ as compared with the preceding step, due to the section along the line 42—42 in FIG. 41.

Figure 45:
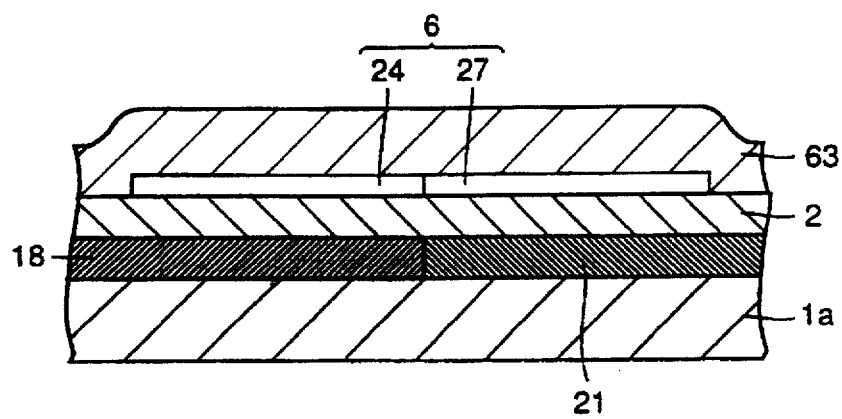

Referring to FIG. 45, a silicon dioxide layer 63 is formed on the semiconductor substrate 1a by CVD, to have the minimum thickness of about 2000 Å.

Figure 46:
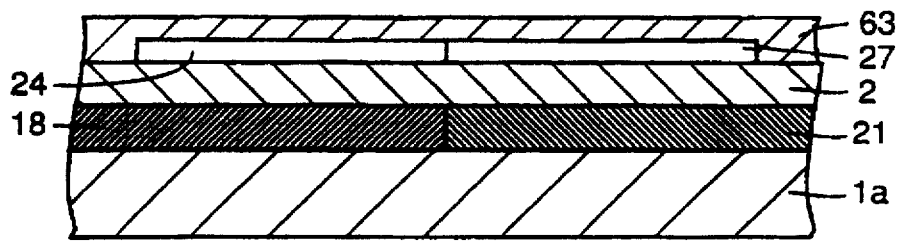

Referring to FIGS. 45 and 46, the surface of the silicon dioxide layer 63 is flattened by CMP (chemical mechanical polishing).

Figure 47:
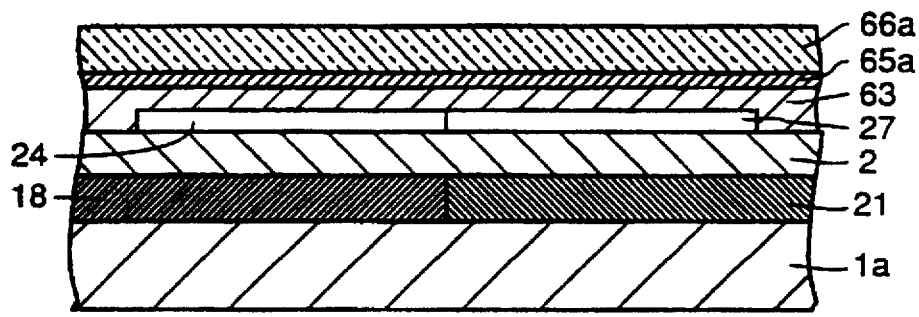

Referring to FIG. 47, a gate insulating layer 65a, consisting of silicon dioxide, of about 100 to 200 Å in thickness is formed by CVD. A polysilicon layer 66a containing impurity ions is formed on the gate insulating layer 65a to be about 2000 Å in thickness.

Figure 48:
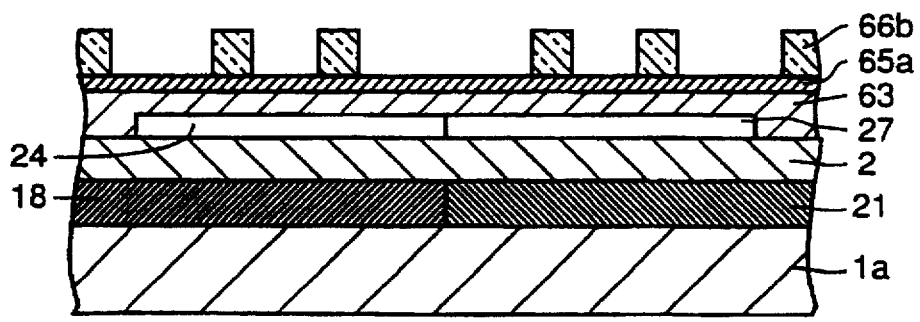

Referring to FIGS. 47 and 48, the polysilicon layer 66a is anisotropically etched by photolithography, thereby forming word lines (gate electrodes) 66b.

Figure 49:
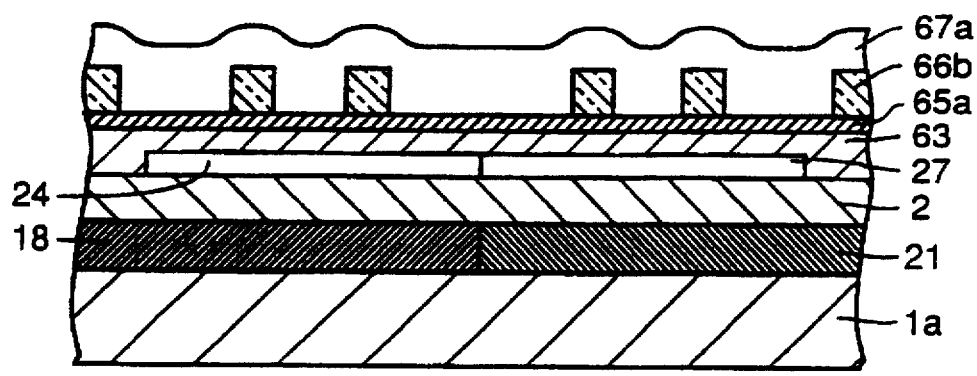

Referring to FIG. 49, an insulating layer 67a consisting of silicon dioxide is formed in a thickness of about 2000 Å, to cover the word lines (gate electrodes) 66b.

Figure 50:
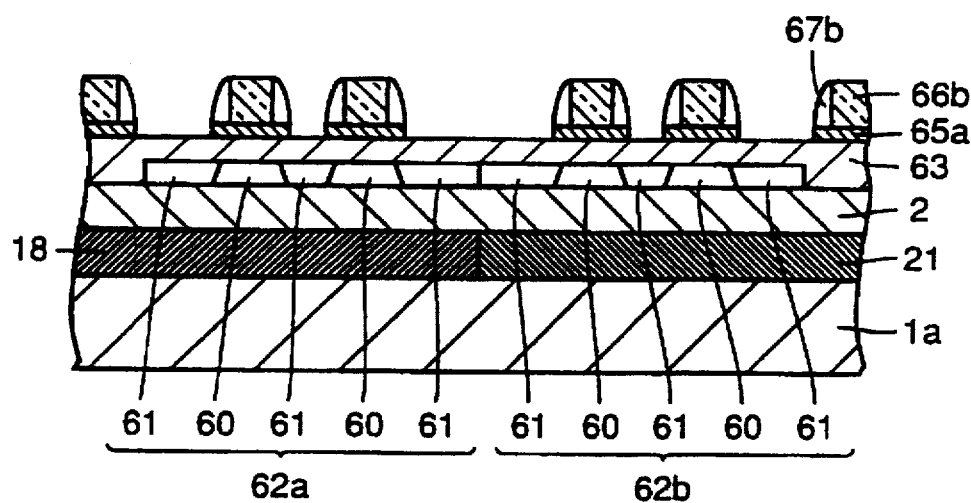

Referring to FIGS. 49 and 50, the insulating layer 67a is anisotropically etched to form side wall spacers 67b on side walls of the word lines (gate electrodes) 66b. Then, impurity ions are implanted into the active region, thereby forming source/drain layers 61.

In order to form source/drain layers of LDD structures, low-concentration impurity layers are formed in the active region after formation of the word lines (gate electrodes) 66b, and then the side wall spacers 67b are formed, followed by formation of high-concentration impurity regions.

As hereinabove described, the high-concentration impurity layer is provided in the semiconductor substrate immediately under the buried insulating layer in the semiconductor device according to the first aspect of the present invention, whereby a weak inversion region is formed in a lower portion of the channel layer due to the difference between the work functions of the high-concentration impurity layer and the channel layer of the transistor which is formed thereon. Consequently, it is possible to obtain a thin-film SOI-MOSFET which can suppress generation of a hump current and minimize an OFF-state current.

In the method of fabricating a semiconductor device according to the second aspect of the present invention, the high-concentration impurity layer is formed immediately under the buried insulating layer, whereby a semiconductor device having a weak inversion region which is formed in a lower portion of a channel layer of a transistor can be effectively obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate having a major surface;

a buried insulating layer being provided in said semiconductor substrate in a position separated from said major surface;

a LOCOS isolation film being provided in said major surface of said semiconductor substrate for isolating an active region from other active regions; and a thin-film transistor being provided in said active region, said thin-film transistor including a gate electrode being provided on said active region with interposition of a gate insulating layer, and a pair of source/drain layers being provided in said major surface of said semiconductor substrate on both sides of said gate electrode, said semiconductor device further comprising a high-concentration impurity layer being provided in said semiconductor substrate immediately under said buried insulating layer, wherein said high-concentration impurity layer is formed only under a boundary portion between said LOCOS isolation film and said active region.

2. The semiconductor device in accordance with claim 1, wherein said thin-film transistor includes a planar transistor.

3. The semiconductor device in accordance with claim 1, wherein said thin-film transistor includes a mesa transistor.

4. The semiconductor device in accordance with claim 1, wherein said source/drain layers and said high-concentration impurity layer are of the same conductivity type.

5. A method of fabricating a semiconductor device, for forming a transistor on an SOI substrate, said method comprising the steps of:

forming a buried insulating layer in a semiconductor substrate in a position separated from a major surface of said semiconductor substrate;

forming a high-concentration impurity layer in said semiconductor substrate immediately under said buried insulating layer;

forming a LOCOS oxide film in said major surface of said semiconductor substrate for isolating an active region from other active regions;

forming a gate electrode on said active region with interposition of a gate insulating film; and forming a pair of source/drain layers in a major surface of said active region on both sides of said gate electrode, wherein said high-concentration impurity layer is formed only in a portion under a boundary portion between said LOCOS oxide film and said active region.

6. The method of fabricating a semiconductor device in accordance with claim 5, wherein said transistor includes a planar transistor.

7. The method of fabricating a semiconductor device in accordance with claim 5, wherein said transistor includes a mesa transistor.

8. The method of fabricating a semiconductor device in accordance with claim 5, being carried out while rendering said high-concentration impurity layer and said source/drain layers of the same conductivity type.

* * * * *